(12) United States Patent
Kim et al.

(10) Patent No.: US 11,903,187 B2
(45) Date of Patent: Feb. 13, 2024

(54) SEMICONDUCTOR DEVICES

(71) Applicant: Samsung Electronics Co., Ltd., Suwon-si (KR)

(72) Inventors: Eunjung Kim, Daegu (KR); Hyewon Kim, Hwaseong-si (KR); Sei-Ryung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 131 days.

(21) Appl. No.: 17/547,306

(22) Filed: Dec. 10, 2021

(65) Prior Publication Data

US 2022/0352178 A1 Nov. 3, 2022

(30) Foreign Application Priority Data

Apr. 30, 2021 (KR) .................. 10-2021-0056324

(51) Int. Cl.
*H01L 21/762* (2006.01)
*H10B 12/00* (2023.01)

(52) U.S. Cl.
CPC ....... *H10B 12/50* (2023.02); *H01L 21/76229* (2013.01); *H10B 12/315* (2023.02); *H10B 12/34* (2023.02)

(58) Field of Classification Search
CPC ........ H10B 12/09; H10B 12/34; H10B 12/50; H10B 12/315; H01L 21/76229
See application file for complete search history.

(56) References Cited

U.S. PATENT DOCUMENTS

| | | | |
|---|---|---|---|
| 4,022,941 A | 5/1977 | Prokai et al. |
| 4,376,348 A | 3/1983 | Ackeret |
| 4,386,085 A | 5/1983 | Teutsch et al. |
| 4,425,384 A | 1/1984 | Brownscombe |
| 4,448,547 A | 5/1984 | Wickersheim |
| 5,061,979 A | 10/1991 | Kobayashi et al. |
| 5,073,012 A | 12/1991 | Lynam |
| 5,111,497 A | 5/1992 | Bliven et al. |
| 5,243,202 A | 9/1993 | Mori et al. |
| 5,589,563 A | 12/1996 | Ward et al. |
| 5,717,943 A | 2/1998 | Barker et al. |

(Continued)

FOREIGN PATENT DOCUMENTS

JP 2015198219 A * 11/2015 ......... H01L 21/7624
KR 100511921 B1 9/2005

(Continued)

*Primary Examiner* — Edward Chin
(74) *Attorney, Agent, or Firm* — Muir Patent Law, PLLC

(57) ABSTRACT

A semiconductor device includes a substrate including a cell region, a peripheral region, and a boundary region between the cell region and the peripheral region, cell active patterns on the cell region of the substrate, peripheral active patterns on the peripheral region of the substrate, a boundary insulating pattern disposed on the boundary region of the substrate and disposed between the cell active patterns and the peripheral active patterns, and a bumper pattern disposed on the cell region of the substrate and disposed between the boundary insulating pattern and the cell active patterns. A width of the bumper pattern in a first direction parallel to a top surface of the substrate is greater than a width of each of the cell active patterns in the first direction.

17 Claims, 26 Drawing Sheets

(56) References Cited

U.S. PATENT DOCUMENTS

| | | |
|---|---|---|
| 5,798,042 A | 8/1998 | Chu et al. |
| 5,818,095 A | 10/1998 | Sampsell |
| 5,863,823 A | 1/1999 | Burgener |
| 6,088,070 A | 7/2000 | Ohtani et al. |
| 6,136,269 A | 10/2000 | Winkler et al. |
| 6,326,642 B1 | 12/2001 | Yamazaki et al. |
| 6,339,604 B1 | 1/2002 | Smart |
| 6,340,878 B1 | 1/2002 | Oglesbee |
| 6,541,580 B1 | 4/2003 | Matyjaszewski et al. |
| 6,592,999 B1 | 7/2003 | Anderson et al. |
| 6,665,044 B1 | 12/2003 | Jacobsen et al. |
| 6,716,895 B1 | 4/2004 | Terry |
| 6,721,597 B1 | 4/2004 | Bardy et al. |
| 6,756,633 B2 | 6/2004 | Wang et al. |
| 6,815,781 B2 | 11/2004 | Vyvoda et al. |
| 6,837,887 B2 | 1/2005 | Woloszko et al. |
| 6,837,888 B2 | 1/2005 | Ciarrocca et al. |
| 6,850,312 B2 | 2/2005 | Jacobsen et al. |
| 6,858,906 B2 | 2/2005 | Lee et al. |
| 6,864,570 B2 | 3/2005 | Smith |
| 6,896,674 B1 | 5/2005 | Woloszko et al. |
| 6,917,525 B2 | 7/2005 | Mok et al. |
| 6,927,463 B2 | 8/2005 | Iwata et al. |
| 6,949,096 B2 | 9/2005 | Davison et al. |
| 6,974,453 B2 | 12/2005 | Woloszko et al. |
| 6,976,647 B2 | 12/2005 | Reed et al. |
| 6,977,392 B2 | 12/2005 | Yamazaki et al. |
| 6,991,671 B2 | 1/2006 | Brestovansky et al. |
| 7,012,053 B1 | 3/2006 | Barnabas et al. |
| 7,078,026 B2 | 7/2006 | Ferrari et al. |
| 7,194,309 B2 | 3/2007 | Ostroff et al. |
| 7,225,518 B2 | 6/2007 | Eidenschink et al. |
| 7,345,505 B2 | 3/2008 | Madurawe |
| 7,351,470 B2 | 4/2008 | Draheim et al. |
| 7,381,601 B2 | 6/2008 | Kim et al. |
| 7,467,003 B2 | 12/2008 | Brister et al. |
| 7,476,874 B2 | 1/2009 | Patel |
| 7,582,575 B2 | 9/2009 | Fukazawa et al. |
| 7,704,518 B2 | 4/2010 | Tamarkin et al. |
| 7,859,738 B2 | 12/2010 | Baur et al. |
| 7,884,349 B2 | 2/2011 | Rinerson et al. |
| 7,888,168 B2 | 2/2011 | Weidman et al. |
| 7,916,013 B2 | 3/2011 | Stevenson |
| 7,964,107 B2 | 6/2011 | Millward |
| 7,971,850 B2 | 7/2011 | Heim et al. |
| 7,993,773 B2 | 8/2011 | Snyder et al. |
| 8,021,778 B2 | 9/2011 | Snyder et al. |
| 8,027,215 B2 | 9/2011 | Lambertson et al. |
| 8,077,536 B2 | 12/2011 | Widjaja |
| 8,183,665 B2 | 5/2012 | Bertin et al. |
| 8,194,451 B2 | 6/2012 | Widjaja |
| 8,242,522 B1 | 8/2012 | Raring |
| 8,254,425 B1 | 8/2012 | Raring |
| 8,294,179 B1 | 10/2012 | Raring |
| 8,350,330 B2 | 1/2013 | Lu et al. |
| 8,351,478 B2 | 1/2013 | Raring et al. |
| 8,355,418 B2 | 1/2013 | Raring et al. |
| 8,634,442 B1 | 1/2014 | Raring et al. |
| 8,795,693 B2 | 8/2014 | Tamarkin et al. |
| 8,837,545 B2 | 9/2014 | Raring |
| 9,035,396 B2 | 5/2015 | Kwon et al. |
| 9,101,662 B2 | 8/2015 | Tamarkin et al. |
| 9,136,562 B2 | 9/2015 | Singh et al. |
| 9,308,171 B2 | 4/2016 | Wright et al. |
| 9,320,705 B2 | 4/2016 | Tamarkin et al. |
| 9,368,775 B2 | 6/2016 | Visco et al. |
| 9,531,164 B2 | 12/2016 | Raring et al. |
| 9,543,738 B2 | 1/2017 | Raring et al. |
| 9,553,426 B1 | 1/2017 | Raring |
| 9,735,547 B1 | 8/2017 | Raring |
| 9,842,651 B2 | 12/2017 | Harari |
| 9,941,665 B1 | 4/2018 | Raring |
| 10,096,364 B2 | 10/2018 | Harari |
| 10,121,553 B2 | 11/2018 | Harari |
| 10,128,260 B2 | 11/2018 | Chung |
| 10,134,748 B2 | 11/2018 | Liu et al. |
| 10,249,370 B2 | 4/2019 | Harari |
| 10,322,085 B2 | 6/2019 | Tamarkin et al. |
| 10,354,924 B2 | 7/2019 | Liao et al. |
| 10,395,737 B2 | 8/2019 | Harari |
| 10,515,819 B2 | 12/2019 | Park et al. |
| 2005/0167777 A1 | 8/2005 | Lee |
| 2011/0183488 A1 | 7/2011 | Takaishi |
| 2013/0196477 A1* | 8/2013 | Kang ............ H10B 12/09 438/270 |
| 2015/0287746 A1* | 10/2015 | Shinkawata ....... H01L 21/7624 257/347 |
| 2019/0393229 A1* | 12/2019 | Wu .............. H01L 21/76229 |
| 2020/0381290 A1 | 12/2020 | Ramaswamy |
| 2020/0381442 A1* | 12/2020 | Wu ................ H10B 41/49 |
| 2022/0352178 A1* | 11/2022 | Kim ............... H10B 12/50 |

FOREIGN PATENT DOCUMENTS

| | | |
|---|---|---|
| KR | 100870323 B1 | 11/2008 |
| KR | 1020090117317 A | 11/2009 |
| KR | 100935198 B1 | 1/2010 |
| KR | 1020120051919 A | 5/2012 |
| TW | 201724590 A | 7/2017 |
| WO | 2017052586 A1 | 3/2017 |

* cited by examiner

SEMICONDUCTOR DEVICES

CROSS-REFERENCE TO RELATED APPLICATION

This U.S. non-provisional patent application claims priority under 35 U.S.C. § 119 to Korean Patent Application No. 10-2021-0056324, filed on Apr. 30, 2021, in the Korean Intellectual Property Office, the disclosure of which is hereby incorporated by reference in its entirety.

BACKGROUND

Embodiments of the inventive concepts relate to semiconductor devices and methods of manufacturing the same, and more particularly, to semiconductor devices including active patterns formed by patterning a substrate and methods of manufacturing the same.

A semiconductor device may include cell transistors constituting a memory cell array, and peripheral transistors constituting a peripheral circuit for driving the memory cell array. The cell transistors and the peripheral transistors may be disposed on a semiconductor substrate. The semiconductor substrate may include cell active patterns on which the cell transistors are disposed, and peripheral active patterns on which the peripheral transistors are disposed.

As a size and a design rule of the semiconductor device have been reduced, the transistors have also been scaled down. Sizes of the cell and peripheral active patterns have also been reduced by the scale-down of the transistors, and thus various methods for preventing pattern defects of the cell and peripheral active patterns have been studied.

SUMMARY

Embodiments of the inventive concepts may provide semiconductor devices capable of minimizing pattern defects and methods of manufacturing the same.

Embodiments of the inventive concepts may also provide semiconductor devices capable of easily reducing a chip size and methods of manufacturing the same.

In an aspect, a semiconductor device may include a substrate including a cell region, a peripheral region, and a boundary region between the cell region and the peripheral region, cell active patterns on the cell region of the substrate, peripheral active patterns on the peripheral region of the substrate, a boundary insulating pattern disposed on the boundary region of the substrate and disposed between the cell active patterns and the peripheral active patterns, and a bumper pattern disposed on the cell region of the substrate and disposed between the boundary insulating pattern and the cell active patterns. A width of the bumper pattern in a first direction parallel to a top surface of the substrate may be greater than a width of each of the cell active patterns in the first direction.

In an aspect, a semiconductor device may include a substrate including a cell region and a peripheral region, cell active patterns on the cell region of the substrate, peripheral active patterns on the peripheral region of the substrate, a bumper pattern disposed between the cell active patterns and the peripheral active patterns on the substrate, and word lines disposed on the cell region of the substrate and extending in a first direction parallel to a top surface of the substrate. The word lines may intersect the cell active patterns and the bumper pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

Figure 1:
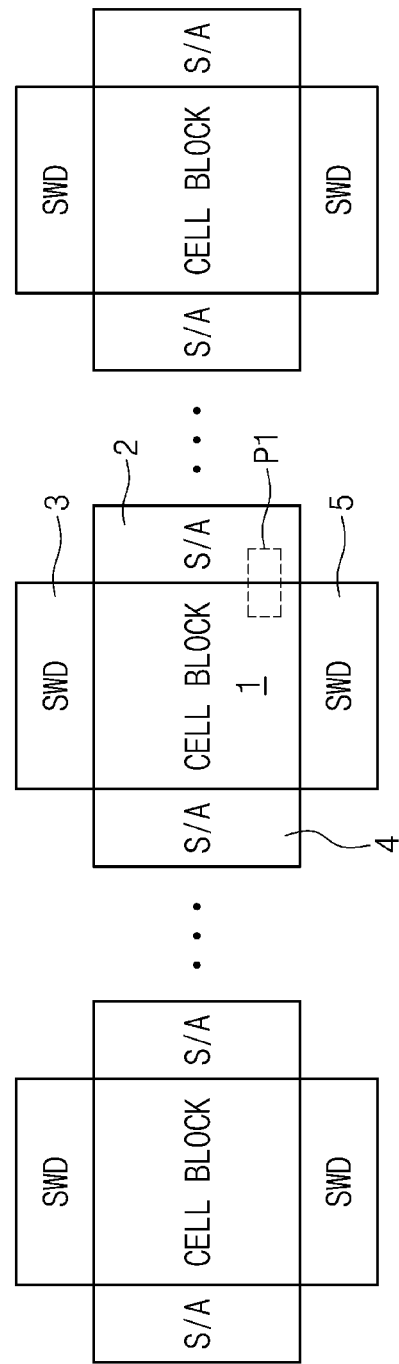
FIG. 1 is a block diagram illustrating a semiconductor device according to some embodiments of the inventive concepts.

FIG. 1 is a block diagram illustrating a semiconductor device according to some embodiments of the inventive concepts.

Referring to FIG. 1, a semiconductor device may include cell blocks 1, and peripheral blocks 2, 3, 4 and 5 disposed around each of the cell blocks 1. The semiconductor device may be a memory device, and each of the cell blocks 1 may include a cell circuit such as a memory integrated circuit. The peripheral blocks 2, 3, 4 and 5 may include various peripheral circuits necessary for the operation of the cell circuit, and the peripheral circuits may be electrically connected to the cell circuit.

The peripheral blocks 2, 3, 4 and 5 may include a first peripheral block 2, a second peripheral block 3, a third peripheral block 4 and a fourth peripheral block 5, which surround each of the cell blocks 1. The first to fourth peripheral blocks 2, 3, 4 and 5 may include a sense amplifier (S/A) circuit, a sub-word line driver (SWD) circuit, and power and ground driver circuits for driving a sense amplifier. For example, the first and third peripheral blocks 2 and 4 facing each other may include the sense amplifier (S/A) circuit, and the second and fourth peripheral blocks 3 and 5 facing each other may include the sub-word line driver (SWD) circuit. The second and fourth peripheral blocks 3 and 5 may further include the power and ground driver circuits for driving a sense amplifier. However, embodiments of the inventive concepts are not limited thereto.

Figure 2:
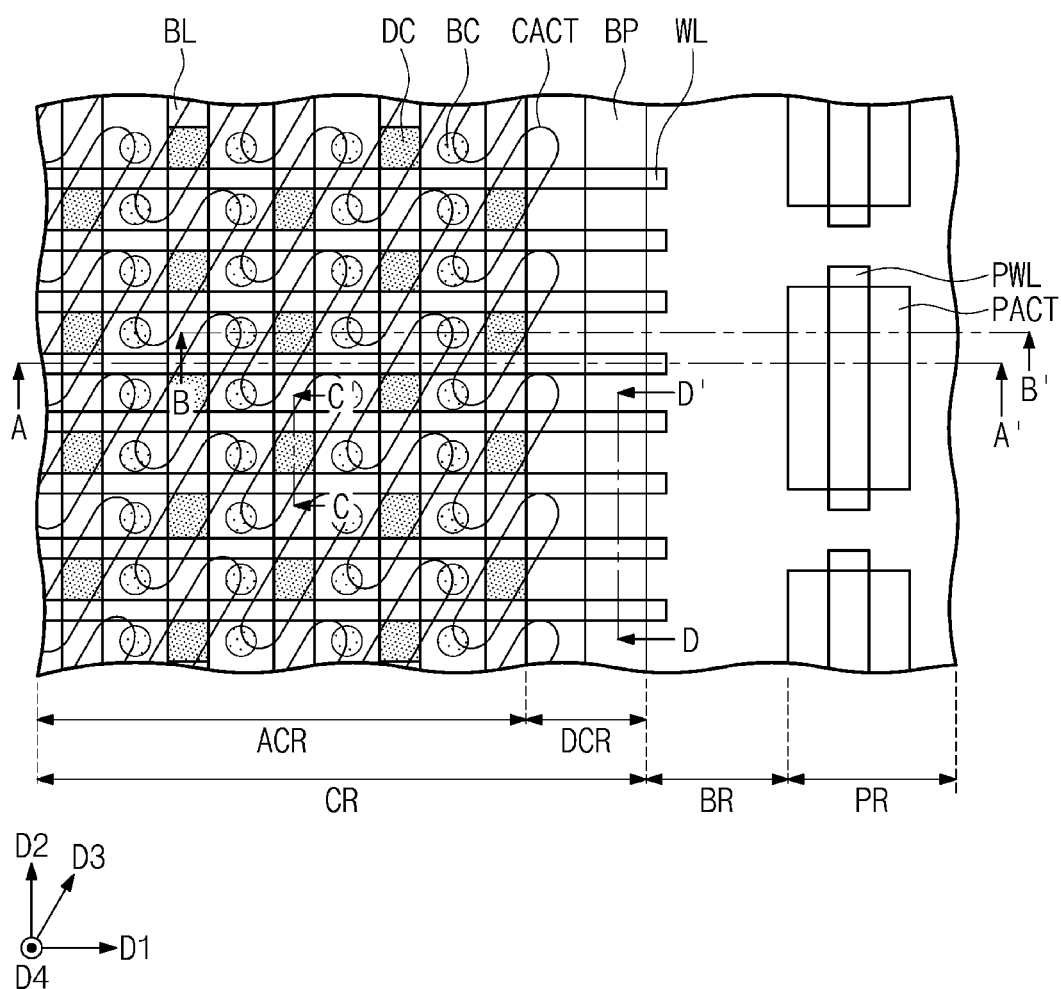
FIG. 2 is a plan view corresponding to a portion 'P1' of FIG. 1 to illustrate a semiconductor device according to some embodiments of the inventive concepts.
Figure 3:
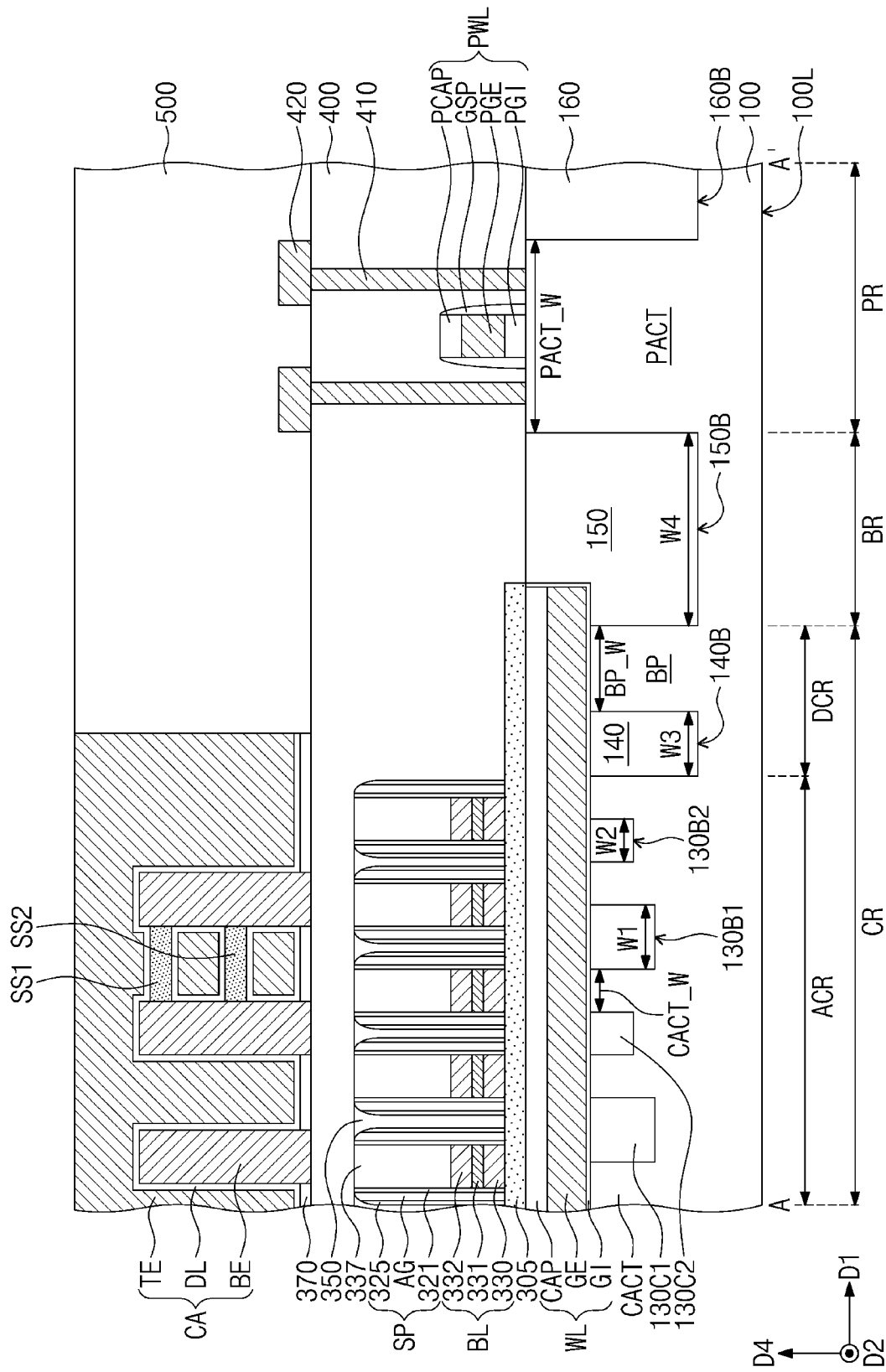
FIG. 3 is a cross-sectional view taken along a line A-A' of FIG. 2.
Figure 4:
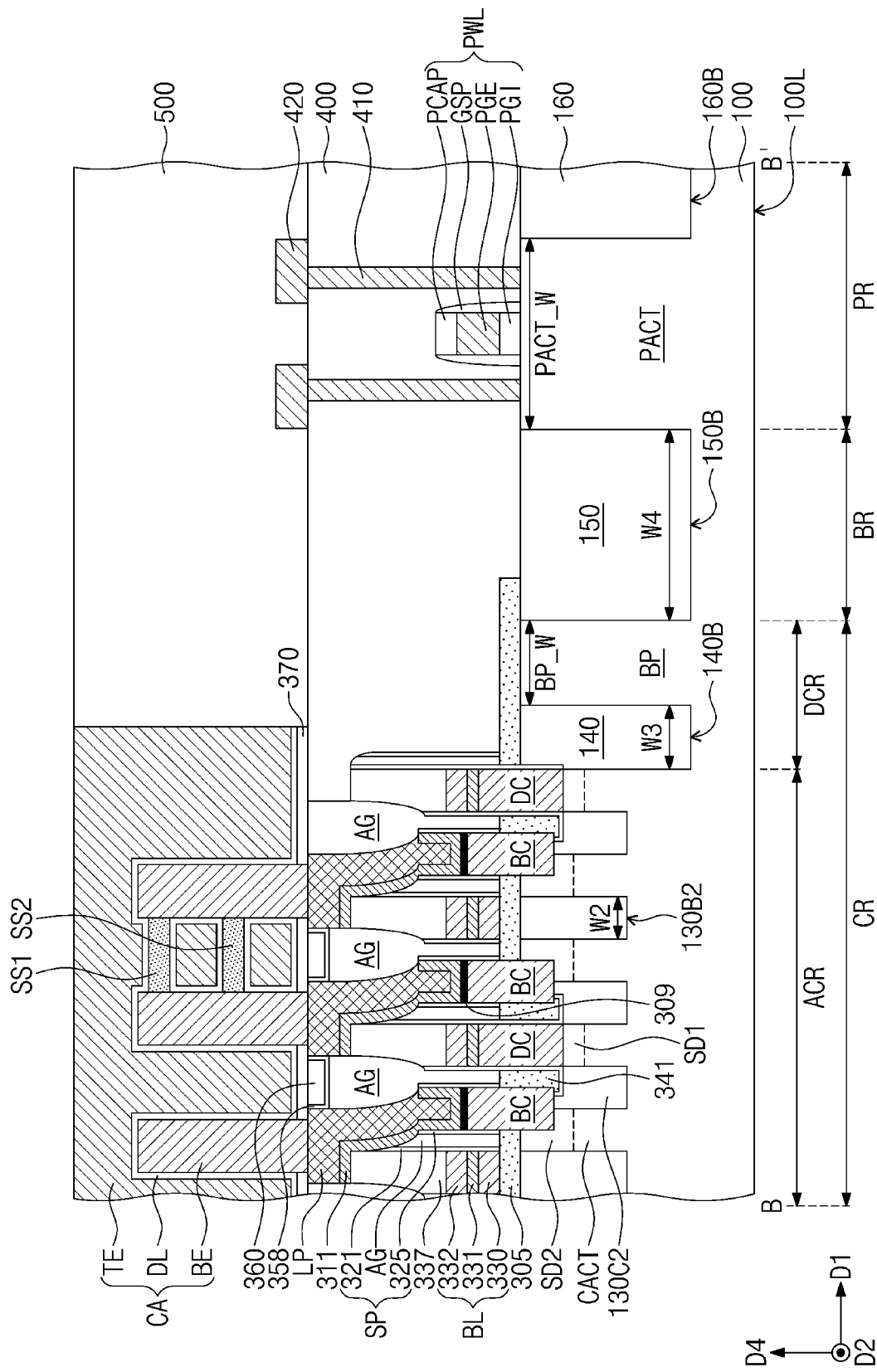
FIG. 4 is a cross-sectional view taken along a line B-B' of FIG. 2.
Figure 5:
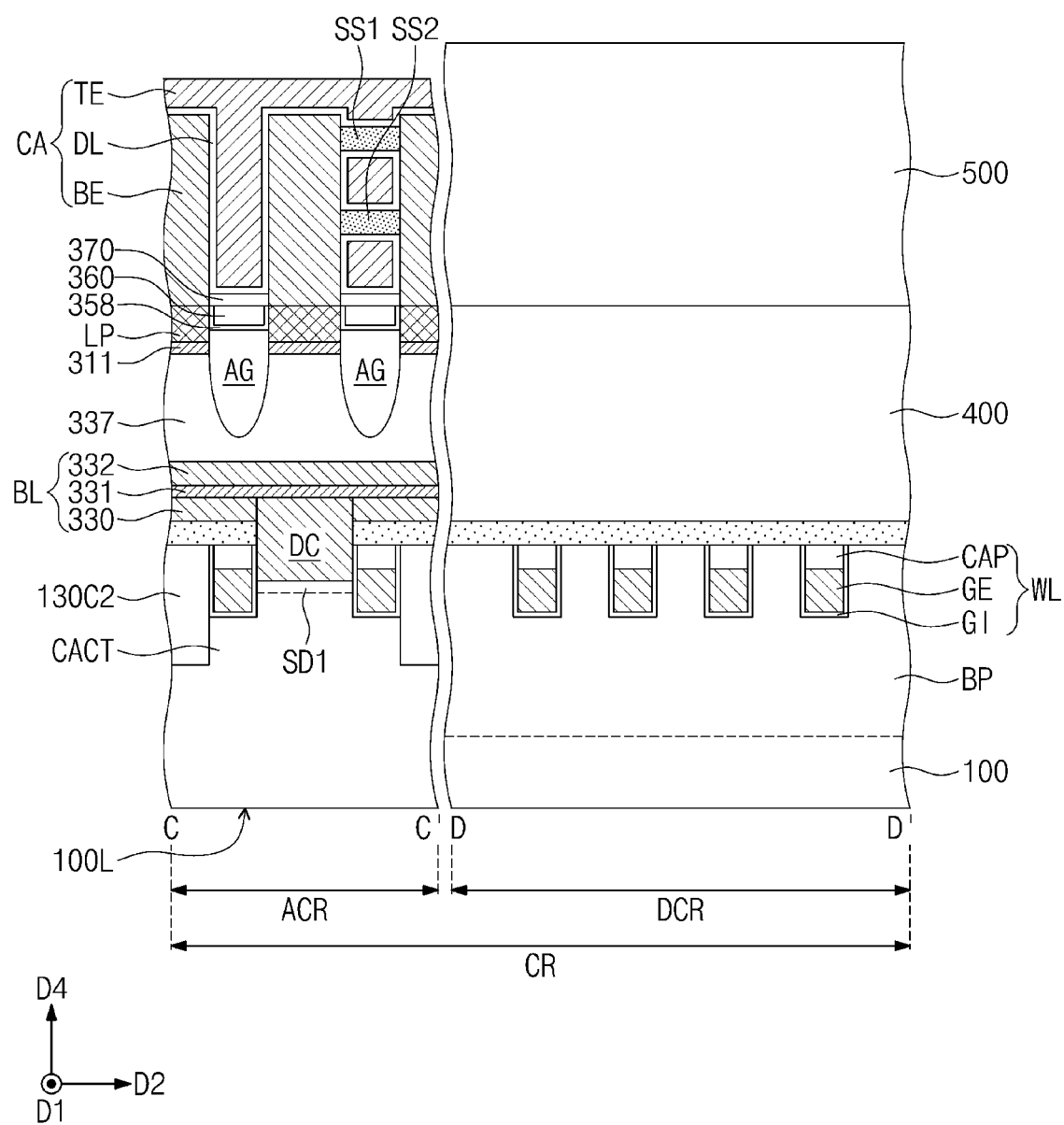
FIG. 5 is a cross-sectional view taken along lines C-C' and D-D' of FIG. 2.

FIG. 2 is a plan view corresponding to a portion 'P1' of FIG. 1 to illustrate a semiconductor device according to some embodiments of the inventive concepts. FIG. 3 is a cross-sectional view taken along a line A-A' of FIG. 2, FIG. 4 is a cross-sectional view taken along a line B-B' of FIG. 2, and FIG. 5 is a cross-sectional view taken along lines C-C' and D-D' of FIG. 2.

Referring to FIGS. 2 to 5, a substrate 100 may be provided. The substrate 100 may be a semiconductor substrate, for example, a silicon substrate, a germanium substrate, or a silicon-germanium substrate. The substrate 100 may include a cell region CR, a peripheral region PR, and a boundary region BR between the cell region CR and the peripheral region PR. The cell region CR may include an active cell region ACR, and a dummy cell region DCR between the active cell region ACR and the boundary region BR. The active cell region ACR may be a region of the substrate 100, on which each of the cell blocks 1 of FIG. 1 is provided, and the dummy cell region DCR may be another region of the substrate 100, on which dummy patterns are provided. The peripheral region PR may be still another region of the substrate 100, on which the peripheral block 2, 3, 4 or 5 of FIG. 1 is provided, and the boundary region BR may be yet another region of the substrate 100, which is disposed between the cell region CR and the peripheral region PR.

Cell active patterns CACT may be disposed on the cell region CR (e.g., the active cell region ACR) of the substrate 100. The cell active patterns CACT may be spaced apart from each other in a first direction D1 and a second direction D2 which are parallel to a bottom surface 100L of the substrate 100. The first direction D1 and the second direction D2 may intersect each other. Each of the cell active patterns CACT may have a bar shape extending in a third direction D3 which is parallel to the bottom surface 100L of the substrate 100 and intersects the first and second directions D1 and D2. Each of the cell active patterns CACT may be a portion of the substrate 100, which protrudes from the substrate 100 in a fourth direction D4 perpendicular to the bottom surface 100L of the substrate 100.

Cell device isolation patterns 130C1 and 130C2 may be disposed between the cell active patterns CACT on the cell region CR (e.g., the active cell region ACR) of the substrate 100. The cell device isolation patterns 130C1 and 130C2 may be disposed in/on the substrate 100 to define the cell active patterns CACT. For example, the cell device isolation patterns 130C1 and 130C2 may contact side walls of the cell active patterns CACT. The cell device isolation patterns 130C1 and 130C2 may have widths in the first direction D1 and may include first cell device isolation patterns 130C1 having a first width W1, and second cell device isolation patterns 130C2 having a second width W2. The first width W1 may be greater than the second width W2 (i.e., W1>W2). Bottom surfaces 130B1 of the first cell device isolation patterns 130C1 may be located at a lower height than bottom surfaces 130B2 of the second cell device isolation patterns 130C2 with respect to the bottom surface 100L of the substrate 100. In the present specification, the 'height' may mean a distance measured from the bottom surface 100L of the substrate 100 in the fourth direction D4. For example, a height may be a vertical level in the fourth direction D4 with respect to a reference plane (e.g., the bottom surface 100L) perpendicular to the fourth direction D4. For example, the cell device isolation patterns 130C1 and 130C2 may include or be formed of silicon oxide, silicon nitride, and/or silicon oxynitride.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Peripheral active patterns PACT may be disposed on the peripheral region PR of the substrate 100. The peripheral active patterns PACT may be spaced apart from each other in a direction parallel to the bottom surface 100L of the substrate 100. Each of the peripheral active patterns PACT may be a portion of the substrate 100, which protrudes from the substrate 100 in the fourth direction D4. Peripheral device isolation patterns 160 may be disposed between the peripheral active patterns PACT on the peripheral region PR of the substrate 100. The peripheral device isolation patterns 160 may be disposed in/on the substrate 100 to define the peripheral active patterns PACT. For example, the peripheral device isolation patterns 160 may contact side walls of the peripheral active patterns PACT. Bottom surfaces 160B of the peripheral device isolation patterns 160 may be located at a lower height than the bottom surfaces 130B1 of the first cell device isolation patterns 130C1 and the bottom surfaces 130B2 of the second cell device isolation patterns 130C2 with respect to the bottom surface 100L of the substrate 100. For example, the peripheral device isolation patterns 160 may include or be formed of silicon oxide, silicon nitride, and/or silicon oxynitride.

The cell active patterns CACT and the peripheral active patterns PACT may have widths in the first direction D1. A width PACT_W of each of the peripheral active patterns PACT may be greater than a width CACT_W of each of the cell active patterns CACT. For example, the width PACT_W and the width CACT_W may be widths in the first direction D1.

A bumper pattern BP may be disposed on the cell region CR (e.g., the dummy cell region DCR) of the substrate 100. The bumper pattern BP may be disposed between the cell active patterns CACT and the peripheral active patterns PACT. The bumper pattern BP may be a portion of the substrate 100, which protrudes from the substrate 100 in the fourth direction D4. The bumper pattern BP may have a line shape extending in the second direction D2. The bumper pattern BP may have a width in the first direction D1. A width BP_W of the bumper pattern BP may be greater than the width CACT_W of each of the cell active patterns CACT and may be less than the width PACT_W of each of the peripheral active patterns PACT. For example, the width BP_W of the bumper pattern BP may be a width in the first direction D1.

A dummy insulating pattern 140 may be disposed between the bumper pattern BP and the cell active patterns CACT on the cell region CR (e.g., the dummy cell region DCR) of the substrate 100. The dummy insulating pattern 140 may be disposed in/on the substrate 100 to define a sidewall of the bumper pattern BP. For example, the dummy insulating pattern 140 may contact a sidewall of the bumper pattern BP. A bottom surface 140B of the dummy insulating pattern 140 may be located at a lower height than the bottom surfaces 130B1 of the first cell device isolation patterns 130C1 and the bottom surfaces 130B2 of the second cell device isolation patterns 130C2 with respect to the bottom surface 100L of the substrate 100. The dummy insulating pattern 140 may have a width in the first direction D1. A third width W3 of the dummy insulating pattern 140 may be greater than the second width W2 of each of the second cell device isolation patterns 130C2 and may be equal to or greater than the first width W1 of each of the first cell device isolation patterns 130C1. For example, the third width W3 may be a width of the dummy insulating pattern 140 in the first direction D1. For example, the dummy insulating pattern 140 may include or be formed of silicon oxide, silicon nitride, and/or silicon oxynitride.

A boundary insulating pattern 150 may be disposed on the boundary region BR of the substrate 100 and may be disposed between the bumper pattern BP and the peripheral active patterns PACT. The boundary insulating pattern 150 may be disposed in/on the substrate 100 to define another sidewall of the bumper pattern BP. For example, the boundary insulating pattern 150 may contact a sidewall of the bumper pattern BP. For example, the dummy insulating pattern 140 and the boundary insulating pattern 150 may contact opposite sidewalls of the bumper pattern BP. A bottom surface 150B of the boundary insulating pattern 150 may be located at a lower height than the bottom surfaces 130B1 of the first cell device isolation patterns 130C1 and the bottom surfaces 130B2 of the second cell device isolation patterns 130C2 with respect to the bottom surface 100L of the substrate 100. For some examples, the bottom surface 150B of the boundary insulating pattern 150 may be located at substantially the same height as the bottom surface 140B of the dummy insulating pattern 140. For certain examples, the bottom surface 150B of the boundary insulating pattern 150 may be located at a higher or lower height than the bottom surface 140B of the dummy insulating pattern 140. The boundary insulating pattern 150 may have a width in the first direction D1. A fourth width W4 of the boundary insulating pattern 150 may be greater than the first width W1 of each of the first cell device isolation patterns 130C1, the second width W2 of each of the second cell device isolation patterns 130C2, and the third width W3 of the dummy insulating pattern 140. For example, the fourth width W4 of the boundary insulating pattern 150 may be a width in the first direction D1. For example, the boundary insulating pattern 150 may include or be formed of silicon oxide, silicon nitride, and/or silicon oxynitride.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The dummy insulating pattern 140, the bumper pattern BP and the boundary insulating pattern 150 may be disposed between the cell active patterns CACT and the peripheral active patterns PACT, and the bumper pattern BP may be disposed between the dummy insulating pattern 140 and the boundary insulating pattern 150. The dummy insulating pattern 140 may be disposed between the bumper pattern BP and the cell active patterns CACT, and the boundary insulating pattern 150 may be disposed between the bumper pattern BP and the peripheral active patterns PACT.

Word lines WL may be disposed on the cell region CR of the substrate 100 and may intersect the cell active patterns CACT and the cell device isolation patterns 130C1 and 130C2, e.g., in a plan view. The word lines WL may extend in the first direction D1 and may be spaced apart from each other in the second direction D2. One or more word lines WL of the word lines WL may extend in the first direction D1 to intersect the bumper pattern BP, e.g., in a plan view.

Each of the word lines WL may include a cell gate electrode GE penetrating upper portions of the cell active patterns CACT and the cell device isolation patterns 130C1 and 130C2, a cell gate dielectric pattern GI disposed between the cell gate electrode GE and the cell active patterns CACT and between the cell gate electrode GE and the cell device isolation patterns 130C1 and 130C2, and a cell gate capping pattern CAP on a top surface of the cell gate electrode GE. A top surface of the cell gate capping pattern CAP may be substantially coplanar with top surfaces of the cell active patterns CACT. For example, the top surface of the cell gate capping pattern CAP may be located at substantially the same height as the top surfaces of the cell active patterns CACT.

The cell gate electrode GE may include or be formed of a conductive material. For example, the conductive material may include or may be at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). For example, the cell gate dielectric pattern GI may include or be formed of at least one of silicon oxide, silicon nitride, or silicon oxynitride. For example, the cell gate capping pattern CAP may include or be formed of at least one of silicon oxide, silicon nitride, or silicon oxynitride.

The cell gate electrode GE of at least one of the word lines WL may extend in the first direction D1 to penetrate an upper portion of the bumper pattern BP. For example, a plurality of cell gate electrodes GE of the word lines WL may extend in the first direction D1 through an upper portion of the bumper pattern BP. The cell gate dielectric pattern GI of the at least one of the word lines WL may extend between the cell gate electrode GE and the bumper pattern BP, and the cell gate capping pattern CAP of the at least one of the word lines WL may extend along a top surface of the cell gate electrode GE. For example, cell gate dielectric patterns G1 may be interposed between cell gate electrodes GE and the bumper pattern BP, and cell gate capping patterns CAP may be formed on the gate electrodes GE of the word lines WL. The top surface of the cell gate capping pattern CAP may be substantially coplanar with a top surface of the bumper pattern BP. For example, the top surface of the cell gate capping pattern CAP may be located at substantially the same height as the top surface of the bumper pattern BP.

A first dopant injection region SD1 and second dopant injection regions SD2 may be provided in each of the cell active patterns CACT. The second dopant injection regions SD2 may be spaced apart from each other with the first dopant injection region SD1 interposed therebetween. The first dopant injection region SD1 may be provided between a pair of the word lines WL intersecting each of the cell active patterns CACT. The second dopant injection regions SD2 may be spaced apart from each other with the pair of word lines WL interposed therebetween. The first and second dopant injection regions SD1 and SD2 may include dopants having the same conductivity type.

An insulating layer 305 may be disposed on the cell region CR of the substrate 100 and may cover the word lines WL, the cell active patterns CACT, the cell device isolation patterns 130C1 and 130C2, the dummy insulating pattern 140, and the bumper pattern BP. The insulating layer 305 may include or be formed of an insulating material such as silicon nitride.

Bit lines BL may be disposed on the cell region CR of the substrate 100 and may be disposed on the insulating layer 305. The bit lines BL may intersect the word lines WL, e.g., in a plan view. For example, the bit lines BL may cross over the word lines WL. The bit lines BL may extend in the second direction D2 and may be spaced apart from each other in the first direction D1. Each of the bit lines BL may include a poly-silicon pattern 330, an ohmic pattern 331 and a metal-containing pattern 332, which are sequentially stacked. Bit line capping patterns 337 may be disposed on the bit lines BL, respectively. The bit line capping patterns 337 may include or be formed of an insulating material such as silicon nitride.

Bit line contacts DC may be disposed under each of the bit lines BL and may be spaced apart from each other in the second direction D2. Each of the bit line contacts DC may be electrically connected to the first dopant injection region SD1 of each of the cell active patterns CACT. For example, the bit line contacts DC may include or be formed of at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). A lower filling insulation layer 341 may be disposed on a sidewall of each of the bit line contacts DC.

Storage node contacts BC may be disposed between a pair of the bit lines BL adjacent to each other, e.g., in a plan view. The storage node contacts BC may be spaced apart from each other in the second direction D2. Each of the storage node contacts BC may be electrically connected to a corresponding one of the second dopant injection regions SD2 of the cell active patterns CACT. The storage node contacts BC may include or be formed of poly-silicon doped or not doped with dopants. Support patterns 350 may be disposed between the pair of bit lines BL and between the storage node contacts BC. The support patterns 350 and the storage node contacts BC may be alternately arranged in the second direction D2 between the pair of bit lines BL. The support patterns 350 may include or be formed of, for example, silicon nitride.

A bit line spacer SP may be disposed between each of the bit lines BL and the storage node contacts BC. The bit line spacer SP may include a first sub-spacer 321 and a second sub-spacer 325, which are spaced apart from each other (e.g., in the first direction) by an air gap AG. The first sub-spacer 321 may cover a sidewall of each of the bit lines BL and a sidewall of each of the bit line capping patterns 337. The second sub-spacer 325 may be adjacent to and/or contact the storage node contacts BC. The first sub-spacer 321 and the second sub-spacer 325 may include or be formed of the same material (e.g., silicon nitride).

A storage node ohmic layer 309 may be disposed on each of the storage node contacts BC. The storage node ohmic layer 309 may include or be formed of a metal silicide. A diffusion barrier pattern 311 may conformally cover the storage node ohmic layer 309, the first and second sub-spacers 321 and 325, and a corresponding bit line capping pattern 337. The diffusion barrier pattern 311 may include or be formed of a metal nitride such as titanium nitride or tantalum nitride. A landing pad LP may be disposed on the diffusion barrier pattern 311. The landing pad LP may be formed of a metal-containing material such as tungsten. An upper portion of the landing pad LP may have a width greater than that of the storage node contact BC. The upper portion of the landing pad LP may be laterally shifted from the storage node contact BC.

A first capping pattern 358 and a second capping pattern 360 may be provided between neighboring landing pads LP. Each of the first and second capping patterns 358 and 360 may include or be formed of a silicon nitride layer, a silicon oxide layer, a silicon oxynitride layer, or a porous layer. For example, the first capping patterns 358 may be formed of a different material from the second capping patterns 360. In certain embodiments, the first and second capping patterns 358 and 360 may be formed of the same material. The air gap AG between the first and second sub-spacers 321 and 325 may extend between the neighboring landing pads LP. The first capping pattern 358, the neighboring landing pads LP and a corresponding bit line capping pattern 337 may be partially exposed by/to the air gap AG.

Lower electrodes BE may be disposed on the landing pads LP, respectively. The lower electrodes BE may include or be formed of at least one of poly-silicon doped with dopants, a metal nitride (e.g., titanium nitride), or a metal (e.g., tungsten, aluminum, or copper). Each of the lower electrodes BE may have a solid cylinder shape or a hollow cylinder or cup shape. An upper support pattern SS1 may support/contact upper sidewalls of the lower electrodes BE, and a lower support pattern SS2 may support/contact lower sidewalls of the lower electrodes BE. The upper and lower support patterns SS1 and SS2 may include or be formed of an insulating material such as silicon nitride, silicon oxide, and/or silicon oxynitride.

An etch stop layer 370 may cover the first and second capping patterns 358 and 360 between the lower electrodes BE. The etch stop layer 370 may include or be formed of an insulating material such as silicon nitride, silicon oxide, and/or silicon oxynitride. A dielectric layer DL may cover surfaces of the lower electrodes BE and surfaces of the upper and lower support patterns SS1 and SS2. For example, the dielectric layer DL may include or be formed of at least one of a silicon oxide layer, a silicon nitride layer, a silicon oxynitride layer, or a high-k dielectric layer (e.g., a hafnium oxide layer). An upper electrode TE may be disposed on the dielectric layer DL and may fill a space between the lower electrodes BE. For example, the upper electrode TE may include or be formed of at least one of poly-silicon doped with dopants, silicon-germanium doped with dopants, a metal nitride (e.g., titanium nitride), or a metal (e.g., tungsten, aluminum, or copper). The lower electrodes BE, the dielectric layer DL and the upper electrode TE may constitute capacitors CA.

Peripheral word lines PWL may be disposed on the peripheral region PR of the substrate 100 and may intersect the peripheral active patterns PACT. Each of the peripheral word lines PWL may include a peripheral gate electrode PGE intersecting a corresponding one of the peripheral active patterns PACT, a peripheral gate dielectric pattern PGI between the substrate 100 and the peripheral gate electrode PGE, a peripheral gate capping pattern PCAP on a top surface of the peripheral gate electrode PGE, and peripheral gate spacers GSP on sidewalls of the peripheral gate electrode PGE.

A first interlayer insulating layer 400 may be disposed on the cell region CR, the boundary region BR and the peripheral region PR of the substrate 100. The first interlayer insulating layer 400 may cover the word lines WL, the bit lines BL and the bumper pattern BP on the cell region CR and may extend onto the boundary region BR to cover the boundary insulating pattern 150. The first interlayer insulating layer 400 may extend onto the peripheral region PR and may cover the peripheral word lines PWL.

Peripheral contacts 410 may be disposed at both sides of each of the peripheral word lines PWL. Each of the peripheral contacts 410 may penetrate the first interlayer insulating layer 400 so as to contact and/or be electrically connected to a corresponding one of the peripheral active patterns PACT. Peripheral interconnection lines 420 may be disposed on the first interlayer insulating layer 400 and may contact and/or be electrically connected to the peripheral contacts 410. The peripheral contacts 410 and the peripheral interconnection lines 420 may include or be formed of a conductive material.

A second interlayer insulating layer 500 may be disposed on the first interlayer insulating layer 400 of the peripheral region PR of the substrate 100. The second interlayer insulating layer 500 may cover/contact the peripheral interconnection lines 420 and may cover/contact a sidewall of the capacitor CA. For example, each of the first and second interlayer insulating layers 400 and 500 may include or may be at least one of a silicon oxide layer, a silicon nitride layer, or a silicon oxynitride layer.

As an integration density of a semiconductor device increases, widths of the cell active patterns CACT may decrease. In this case, cell active patterns CACT, adjacent to the boundary region BR, of the cell active patterns CACT may be bent toward the boundary region BR by strain caused by the boundary insulating pattern 150. In addition, to minimize the bent phenomenon of the cell active patterns CACT, dummy cell active patterns having widths equal to those of the cell active patterns CACT may be formed between the boundary insulating pattern 150 and the cell active patterns CACT. In this case, the number of the dummy cell active patterns required to minimize the bent phenomenon of the cell active patterns CACT may be increased to cause an increase in chip size of a semiconductor device.

According to the embodiments of the inventive concepts, the bumper pattern BP having a size greater than those of the cell active patterns CACT (e.g., a width greater than those of the cell active patterns CACT, e.g., in the first direction D1 or in a direction perpendicular an adjacent/closest side surface of the semiconductor device/chip) may be disposed between the boundary insulating pattern 150 and the cell active patterns CACT. Strain by the boundary insulating pattern 150 may be absorbed by the bumper pattern BP, and thus it may be beneficial to inhibit or prevent the strain by the boundary insulating pattern 150 from affecting the cell active patterns CACT. As a result, the bent phenomenon of the cell active patterns CACT may be prevented/improved.

In addition, since the bumper pattern BP having the size greater than those of the cell active patterns CACT (e.g., the width greater than those of the cell active patterns CACT, e.g., in the first direction D1 or in a direction perpendicular an adjacent/closest side surface of the semiconductor device/chip) is disposed between the boundary insulating pattern 150 and the cell active patterns CACT, dummy cell active patterns having widths equal to those of the cell active patterns CACT may not be additionally formed between the boundary insulating pattern 150 and the cell active patterns CACT, or the number of the dummy cell active patterns may be minimized. Thus, a chip size of a semiconductor device may be easily reduced.

As a result, the semiconductor device capable of minimizing pattern defects of the cell active patterns CACT and of easily reducing the chip size may be provided.

Figure 6:
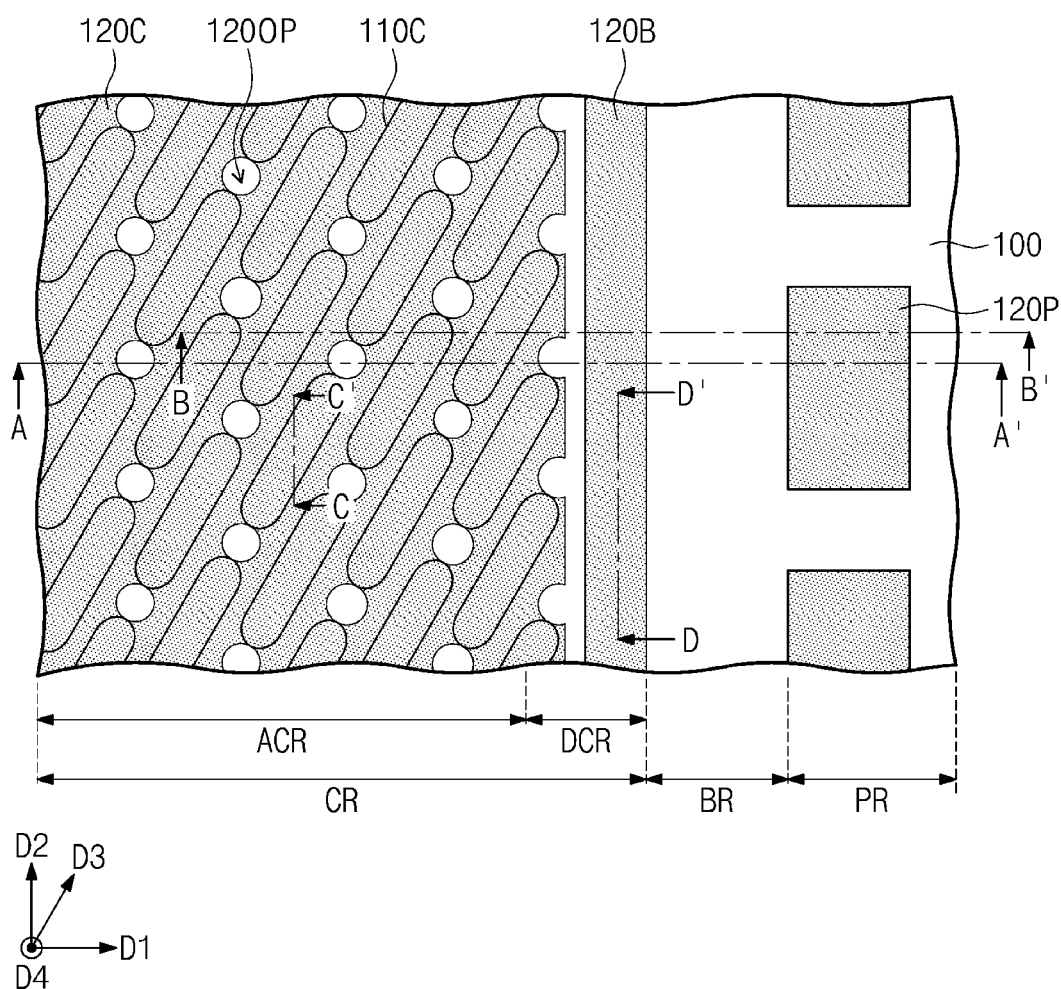
FIGS. 6, 10 and 14 are plan views corresponding to the portion 'P1' of FIG. 1 to illustrate a method of manufacturing a semiconductor device, according to some embodiments of the inventive concepts.
Figure 7:
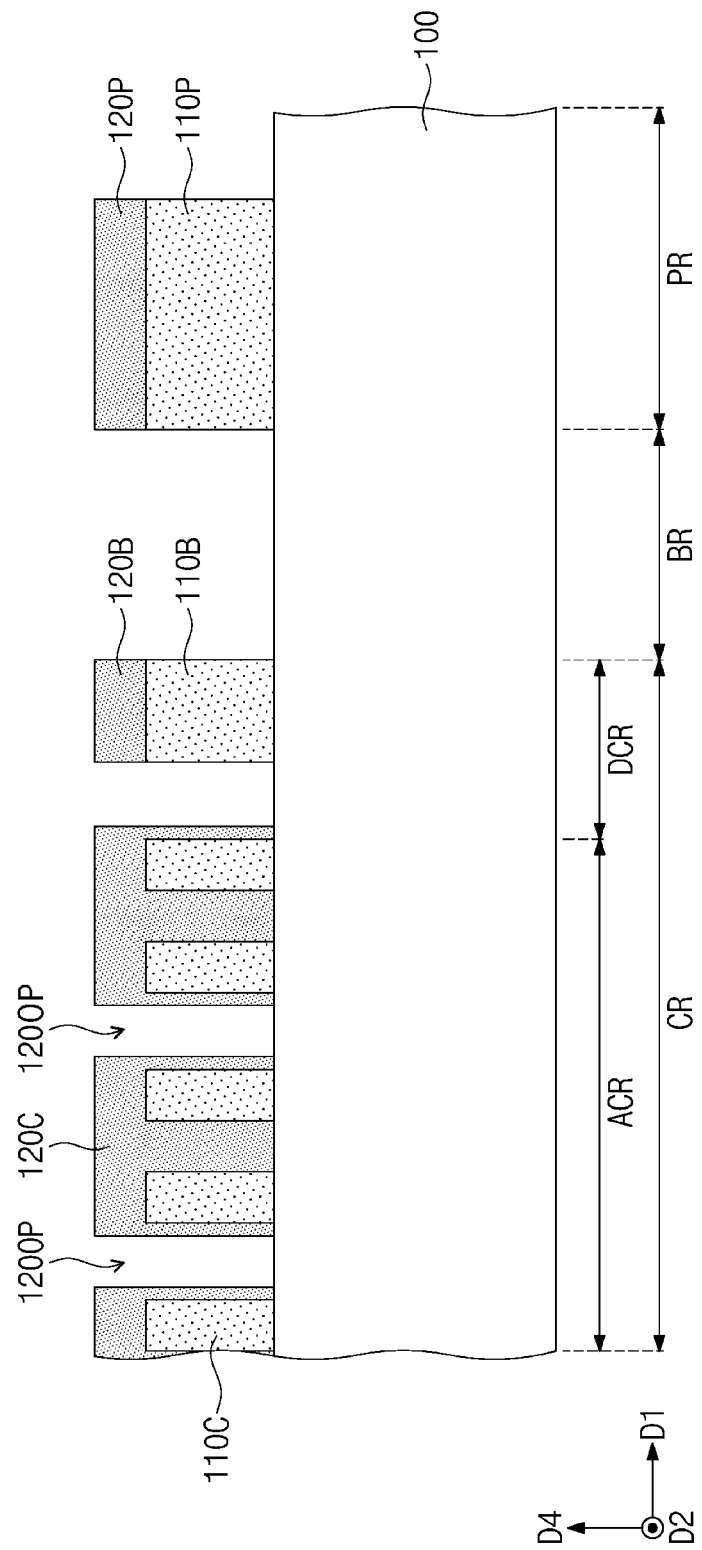
FIGS. 7, 11 and 15 are cross-sectional views taken along lines A-A' of FIGS. 6, 10 and 14, respectively.
Figure 8:
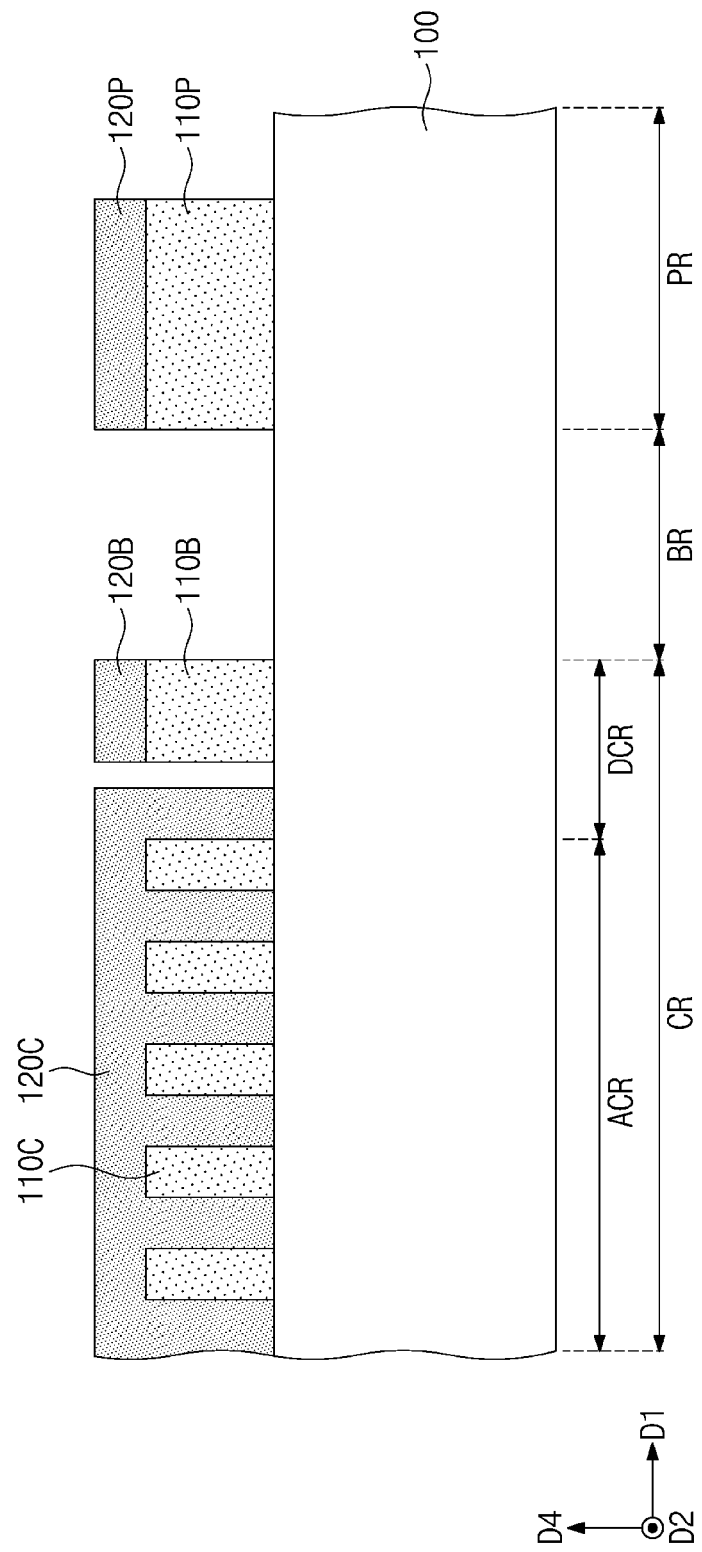
FIGS. 8, 12 and 16 are cross-sectional views taken along lines B-B' of FIGS. 6, 10 and 14, respectively.
Figure 9:
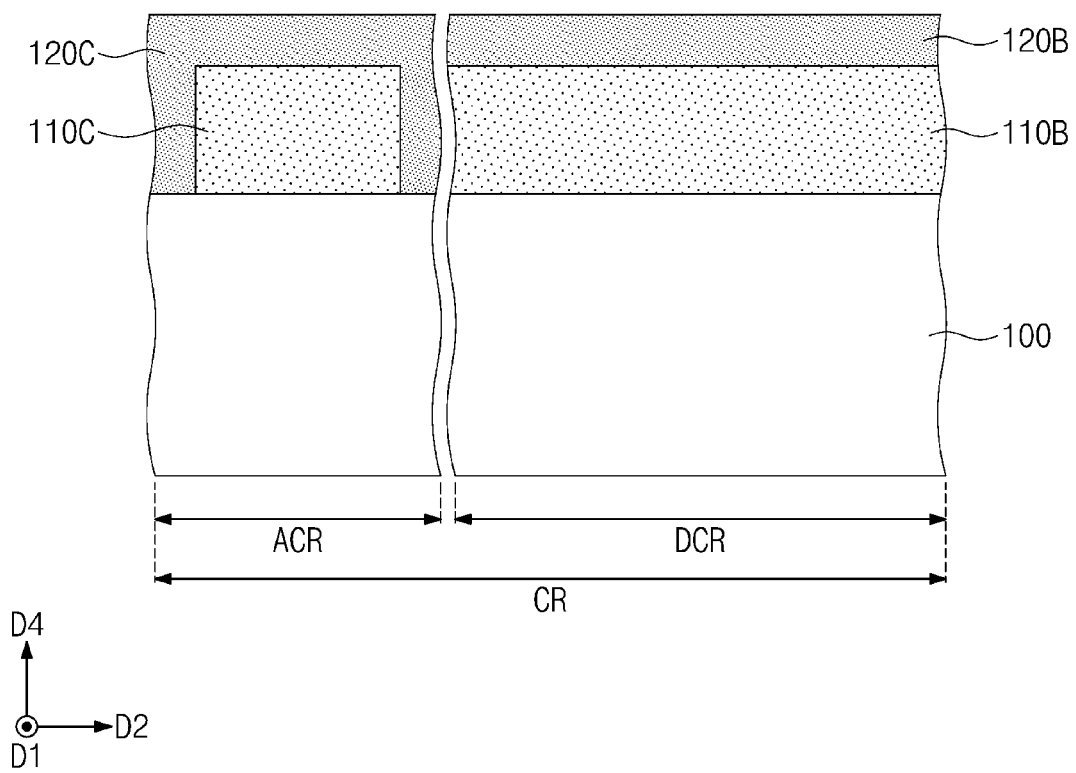
FIGS. 9, 13 and 17 are cross-sectional views taken along lines C-C' and D-D' of FIGS. 6, 10 and 14, respectively.
Figure 10:
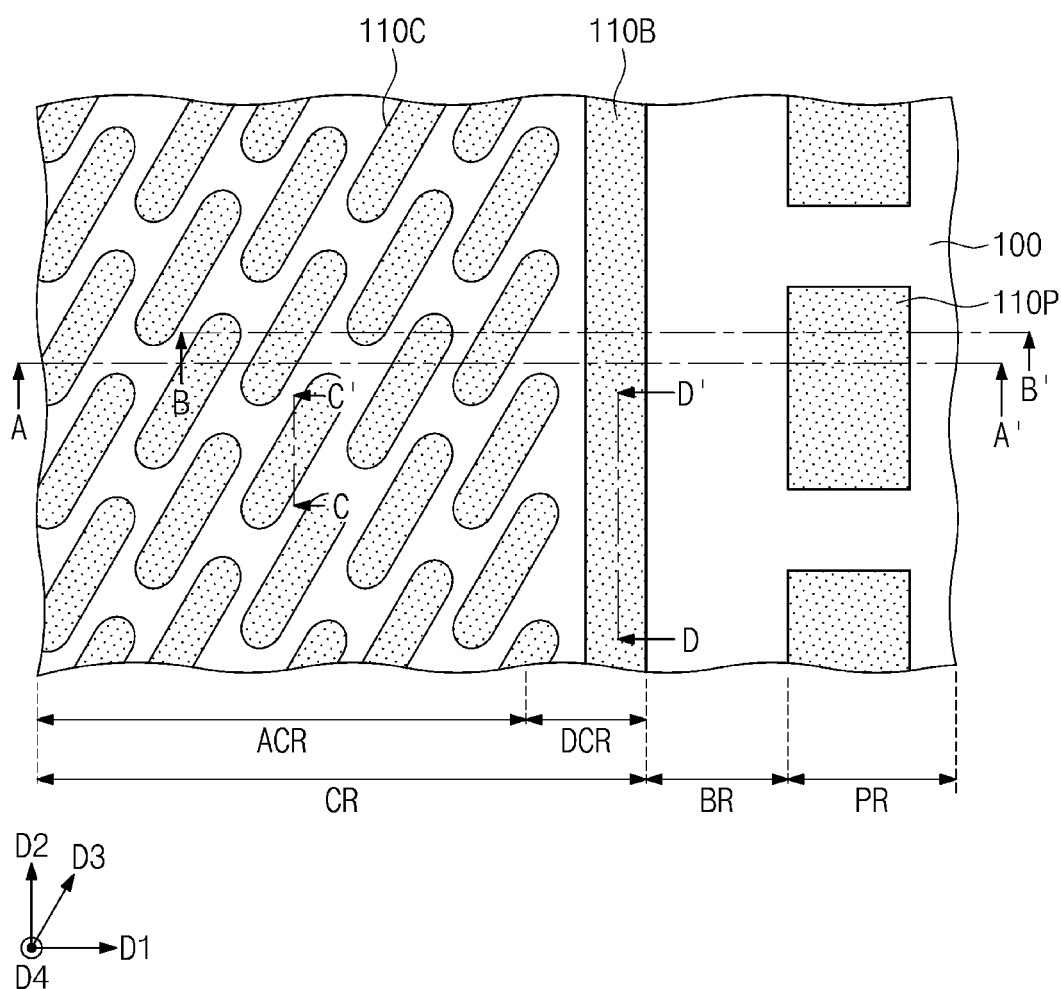
Figure 11:
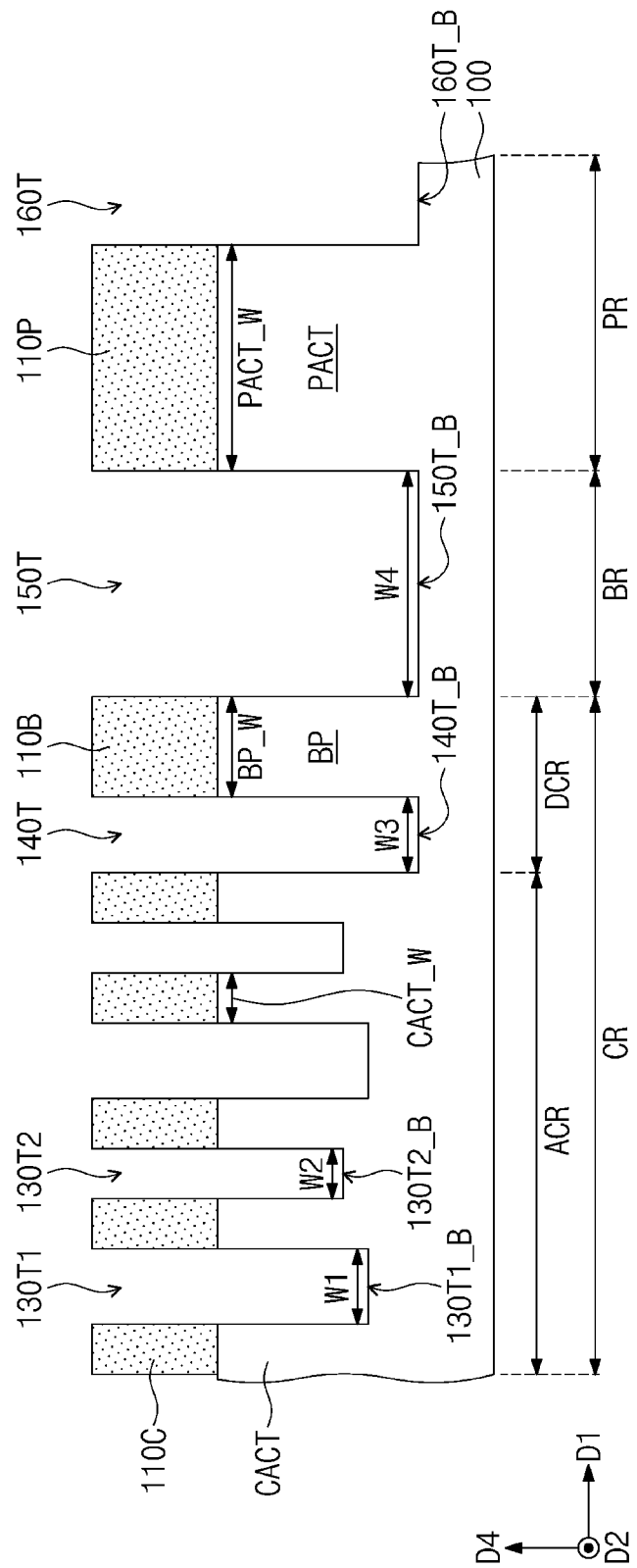
Figure 12:
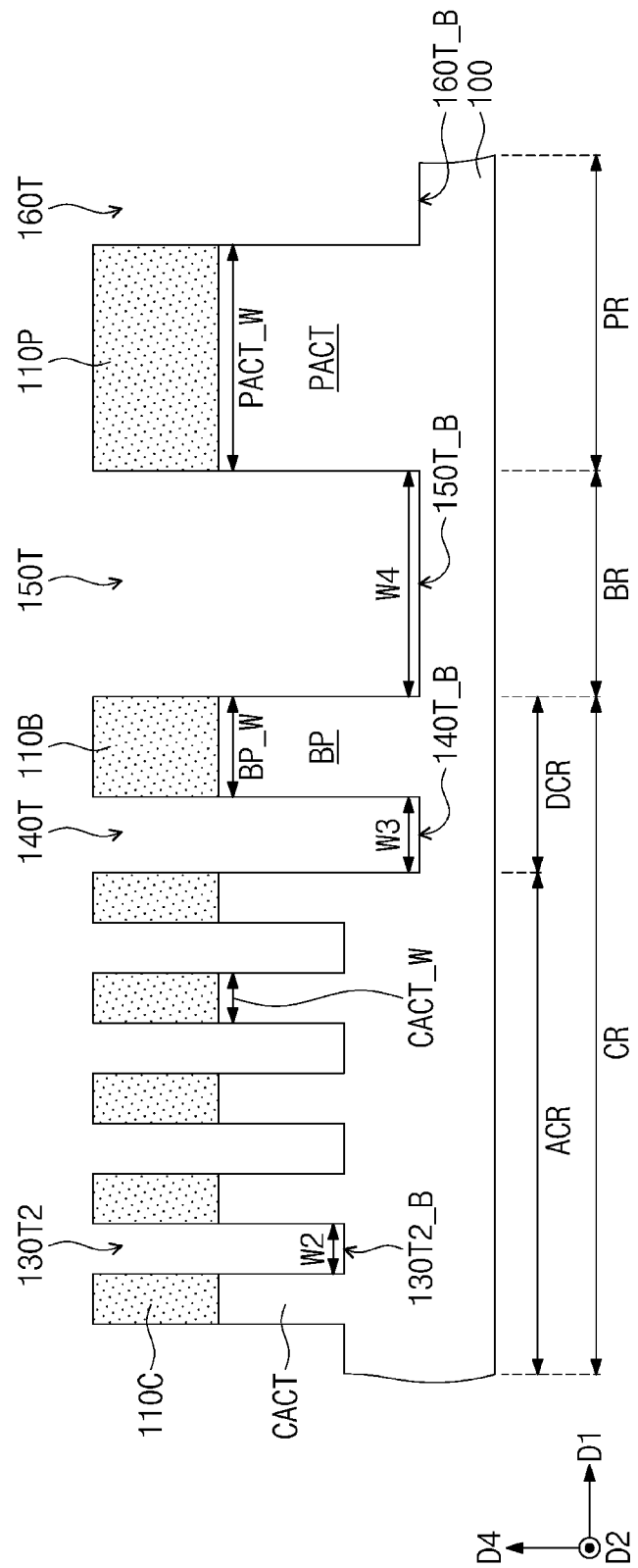
Figure 13:
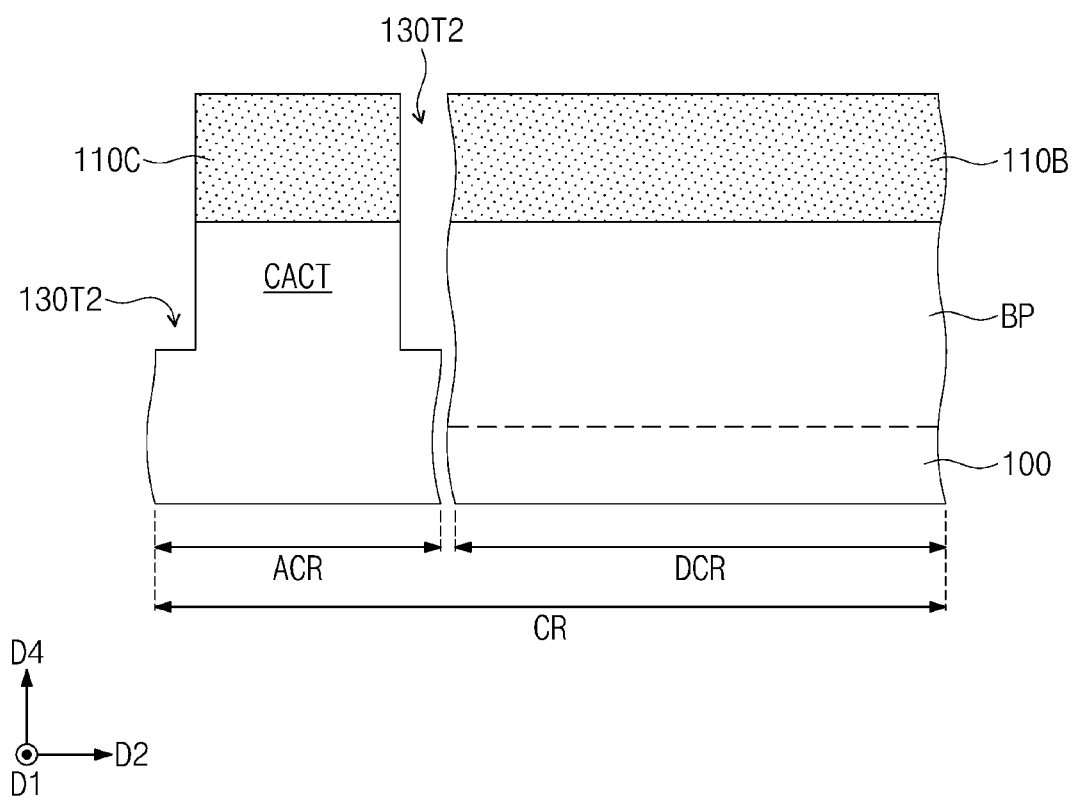
Figure 14:
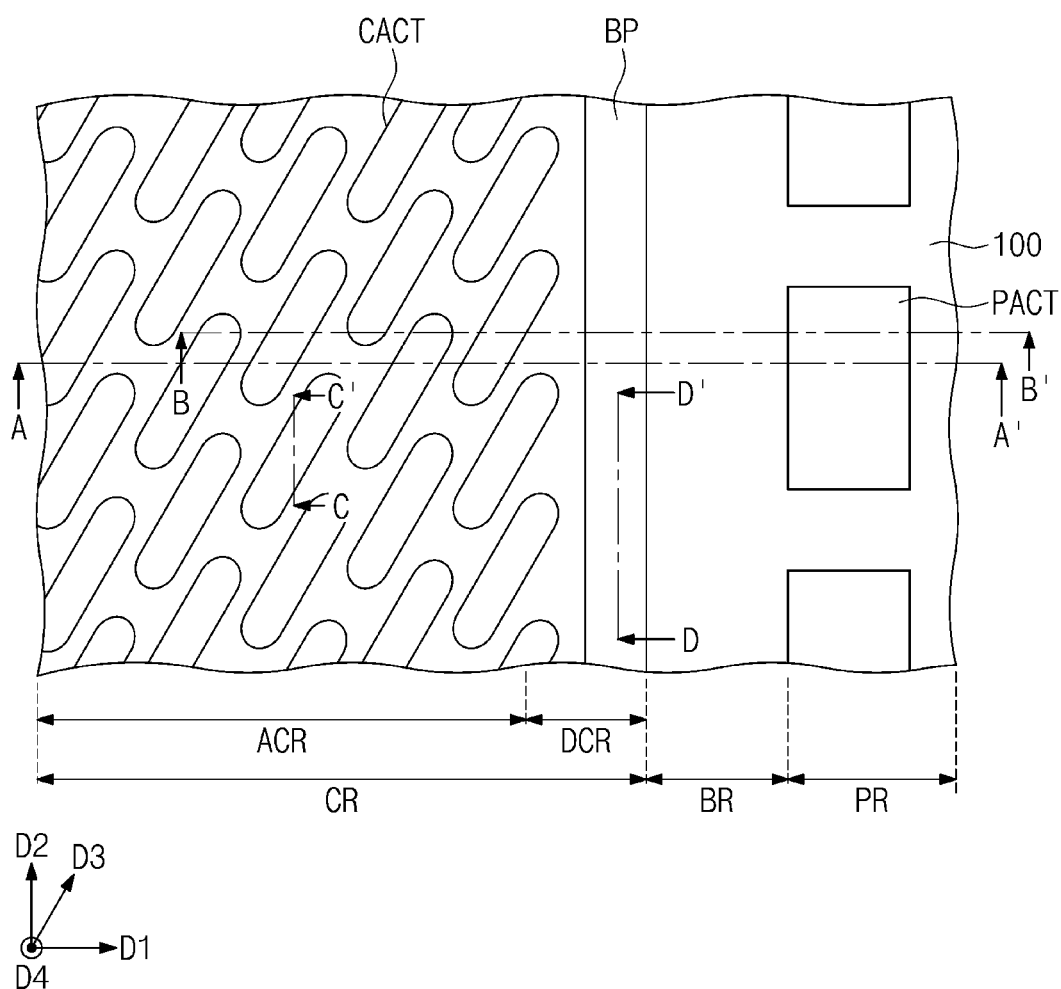
Figure 15:
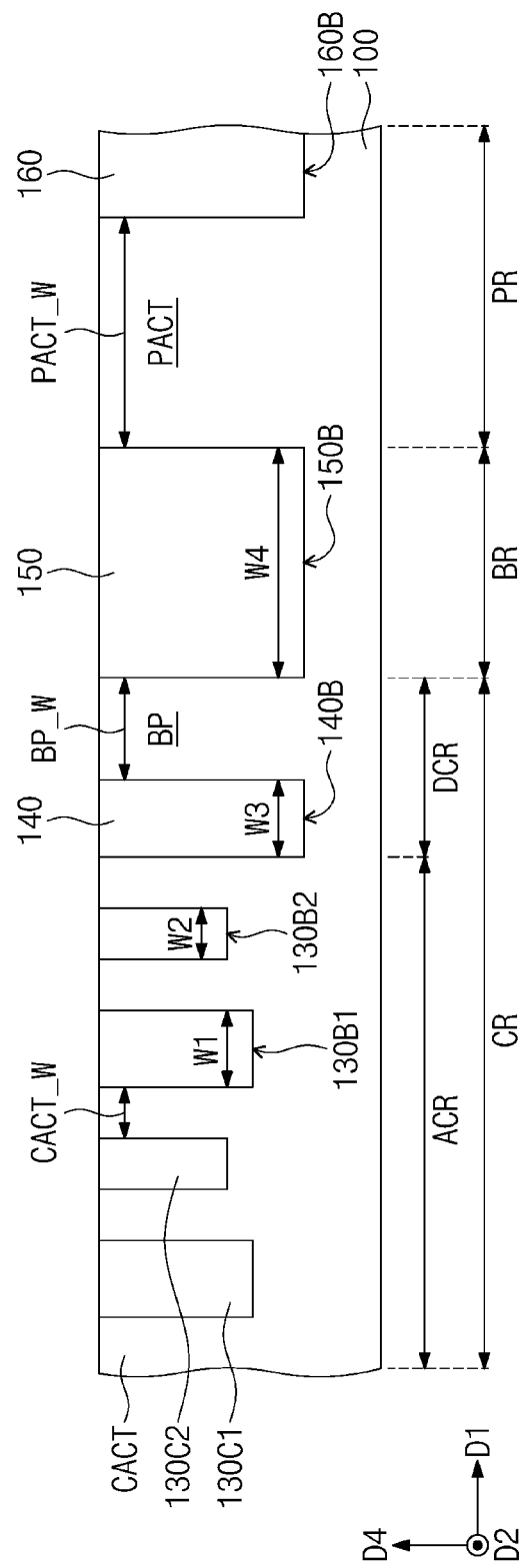
Figure 16:
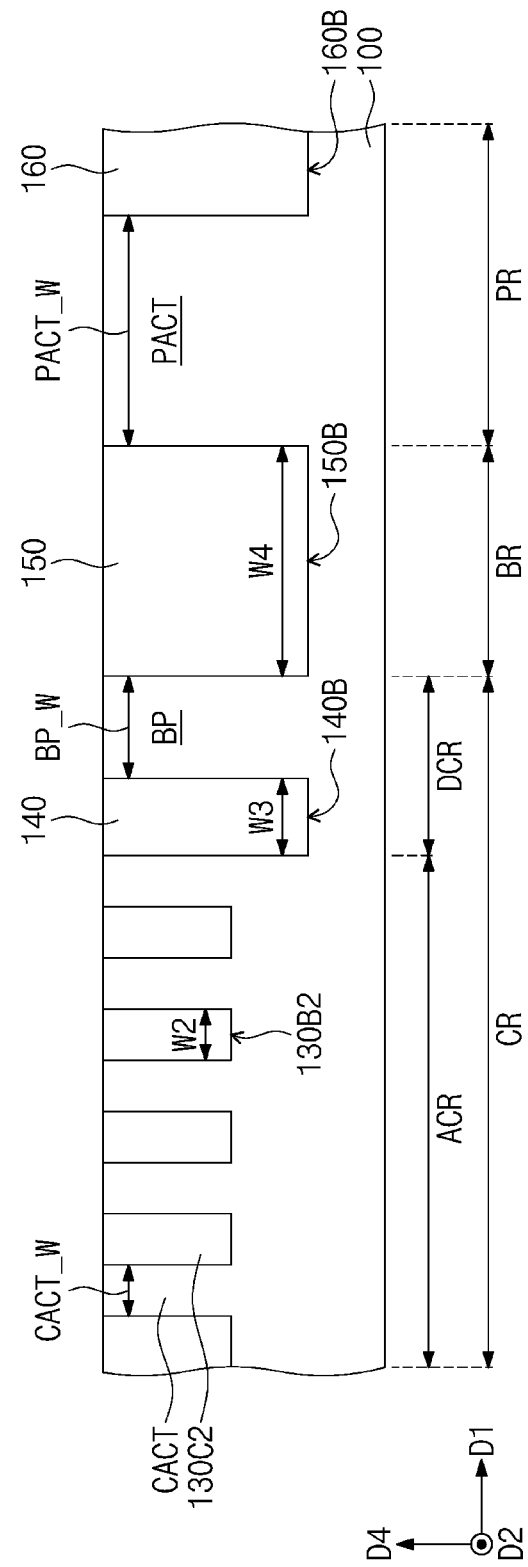
Figure 17:
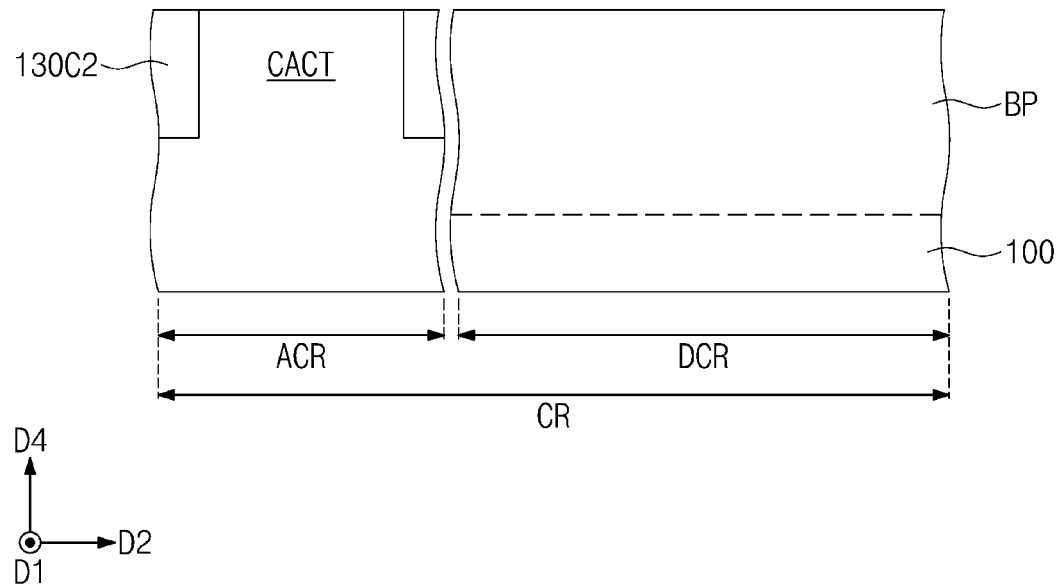

FIGS. 6, 10 and 14 are plan views corresponding to the portion 'P1' of FIG. 1 to illustrate a method of manufacturing a semiconductor device, according to some embodiments of the inventive concepts. FIGS. 7, 11 and 15 are cross-sectional views taken along lines A-A' of FIGS. 6, 10 and 14, respectively. FIGS. 8, 12 and 16 are cross-sectional views taken along lines B-B' of FIGS. 6, 10 and 14, respectively. FIGS. 9, 13 and 17 are cross-sectional views taken along lines C-C' and D-D' of FIGS. 6, 10 and 14, respectively. Hereinafter, the descriptions to the same technical features as described with reference to FIGS. 1 to 5 will be omitted or mentioned briefly for the purpose of ease and convenience in explanation.

Referring to FIGS. 6 to 9, a substrate 100 including a cell region CR, a peripheral region PR and a boundary region BR therebetween may be provided. The cell region CR may include an active cell region ACR, and a dummy cell region DCR between the active cell region ACR and the boundary region BR.

Cell mask patterns 110C may be formed on the active cell region ACR of the substrate 100, and a bumper mask pattern 110B may be formed on the dummy cell region DCR of the substrate 100. Peripheral mask patterns 110P may be formed on the peripheral region PR of the substrate 100. For example, the formation of the cell mask patterns 110C may include forming preliminary cell mask patterns extending in the third direction D3 on the active cell region ACR of the substrate 100, forming a trim mask pattern 120C covering the preliminary cell mask patterns on the active cell region ACR of the substrate 100, and removing portions of each of the preliminary cell mask patterns by using the trim mask pattern 120C as an etch mask. The trim mask pattern 120C may have a plurality of openings 1200P exposing the portions of each of the preliminary cell mask patterns. The removal of the portions of each of the preliminary cell mask patterns may include etching the portions of each of the preliminary cell mask patterns, which are exposed by the plurality of openings 1200P of the trim mask pattern 120C. Since the portions of each of the preliminary cell mask patterns are removed, each of the preliminary cell mask patterns may be divided into the cell mask patterns 110C spaced apart from each other in the third direction D3.

For example, the formation of the bumper mask pattern 110B and the peripheral mask patterns 110P may include forming a mask layer on the dummy cell region DCR, the boundary region BR and the peripheral region PR of the substrate 100, forming a first mask pattern 120B on the mask layer on the dummy cell region DCR, forming second mask patterns 120P on the mask layer on the peripheral region PR, and etching the mask layer using the first mask pattern 120B and the second mask patterns 120P as etch masks. The bumper mask pattern 110B may be formed by etching the mask layer using the first mask pattern 120B as the etch mask, and the peripheral mask patterns 110P may be formed by etching the mask layer using the second mask patterns 120P as the etch masks. The trim mask pattern 120C, the first mask pattern 120B and the second mask patterns 120P may be formed at the same time by using a single photolithography process. The cell mask patterns 110C, the bumper mask pattern 110B and the peripheral mask patterns 110P may be formed at the same time by a single etching process using the trim mask pattern 120C, the first mask pattern 120B and the second mask patterns 120P as etch masks.

Referring to FIGS. 10 to 13, the trim mask pattern 120C, the first mask pattern 120B and the second mask patterns 120P may be removed after the formation of the cell mask patterns 110C, the bumper mask pattern 110B and the peripheral mask patterns 110P. The trim mask pattern 120C, the first mask pattern 120B and the second mask patterns 120P may be removed by, for example, an ashing process and/or a strip process.

An upper portion of the substrate 100 may be etched using the cell mask patterns 110C, the bumper mask pattern 110B and the peripheral mask patterns 110P as etch masks. Thus, cell trenches 130T1 and 130T2, a dummy trench 140T, a boundary trench 150T and peripheral trenches 160T may be formed in the substrate 100.

The cell trenches 130T1 and 130T2 may be formed in the cell region CR (e.g., the active cell region ACR) of the substrate 100 and may define cell active patterns CACT. For example, the cell trenches 130T1 and 130T2 may separate cell active patterns CACT and may be formed between two adjacent cell active patterns CACT. The cell active patterns CACT may be spaced apart from each other in the first direction D1 and the second direction D2, and each of the cell active patterns CACT may have a bar shape extending in the third direction D3. The cell trenches 130T1 and 130T2 may include first cell trenches 130T1 having a first width W1, and second cell trenches 130T2 having a second width W2. Each of the first width W1 and the second width W2 may be a width in the first direction D1, and the first width W1 may be greater than the second width W2 (i.e., W1>W2). The first cell trenches 130T1 having relatively great widths W1 may be formed to be deeper in the substrate 100 than the second cell trenches 130T2 having relatively small widths W2. Thus, bottom surfaces 130T1_B of the first cell trenches 130T1 may be located at a lower height than bottom surfaces 130T2_B of the second cell trenches 130T2.

The dummy trench 140T may be formed in the cell region CR (e.g., the dummy cell region DCR) of the substrate 100, and the boundary trench 150T may be formed in the boundary region BR of the substrate 100. A bumper pattern BP defined by the dummy trench 140T and the boundary trench 150T may be formed on the cell region CR (e.g., the dummy cell region DCR) of the substrate 100. For example, an inner wall of the dummy trench 140T may correspond to a side surface of the bumper pattern BP, and an inner wall of the boundary trench 150T may correspond to another side surface of the bumper pattern BP. The bumper pattern BP may have a line shape extending in the second direction D2.

The dummy trench 140T may expose a sidewall of the bumper pattern BP, and the boundary trench 150T may expose another sidewall of the bumper pattern BP. The dummy trench 140T may have a third width W3 in the first direction D1, and the third width W3 may be greater than the second width W2. The third width W3 may be equal to or greater than the first width W1. The dummy trench 140T may be formed to be deeper into the substrate 100 than the cell trenches 130T1 and 130T2. Thus, a bottom surface 140T_B of the dummy trench 140T may be located at a lower height than the bottom surfaces 130T1_B of the first cell trenches 130T1 and the bottom surfaces 130T2_B of the second cell trenches 130T2. The boundary trench 150T may have a fourth width W4 in the first direction D1, and the fourth width W4 may be greater than the third width W3.

The boundary trench 150T may be formed to be deeper into the substrate 100 than the cell trenches 130T1 and 130T2. Thus, a bottom surface 150T_B of the boundary trench 150T may be located at a lower height than the bottom surfaces 130T1_B of the first cell trenches 130T1 and the bottom surfaces 130T2_B of the second cell trenches 130T2. For some examples, the bottom surface 150T_B of the boundary trench 150T may be located at substantially the same height as the bottom surface 140T_B of the dummy trench 140T. For certain examples, the bottom surface 150T_B of the boundary trench 150T may be located at a higher or lower height than the bottom surface 140T_B of the dummy trench 140T.

The peripheral trenches 160T may be formed in the peripheral region PR of the substrate 100 and may define peripheral active patterns PACT. For example, an inner sidewall of the peripheral trenches 160T may correspond to a side surface of the peripheral active patterns PACT. The peripheral trenches 160T may be formed to be deeper into the substrate 100 than the cell trenches 130T1 and 130T2. Thus, bottom surfaces 160T_B of the peripheral trenches 160T may be located at a lower height than the bottom surfaces 130T1_B of the first cell trenches 130T1 and the bottom surfaces 130T2_B of the second cell trenches 130T2. For example, the bottom surfaces 160T_B of the peripheral trenches 160T may be at the same vertical level as the bottom surface 150T_B of the boundary trench 150T and/or the bottom surface 140T_B of the dummy trench 140T.

The cell active patterns CACT, the bumper pattern BP and the peripheral active patterns PACT may have widths in the first direction D1. A width BP_W of the bumper pattern BP may be greater than a width CACT_W of each of the cell active patterns CACT and may be less than a width PACT_W of each of the peripheral active patterns PACT.

Referring to FIGS. 14 to 17, the cell mask patterns 110C, the bumper mask pattern 110B and the peripheral mask patterns 110P may be removed. The cell mask patterns 110C, the bumper mask pattern 110B and the peripheral mask patterns 110P may be removed by, for example, an ashing process and/or a strip process.

Cell device isolation patterns 130C1 and 130C2, a dummy insulating pattern 140, a boundary insulating pattern 150 and peripheral device isolation patterns 160 may be formed in the cell trenches 130T1 and 130T2, the dummy trench 140T, the boundary trench 150T and the peripheral trenches 160T, respectively. For example, the formation of the cell device isolation patterns 130C1 and 130C2, the dummy insulating pattern 140, the boundary insulating pattern 150 and the peripheral device isolation patterns 160 may include forming an insulating layer on the substrate 100 having the cell trenches 130T1 and 130T2, the dummy trench 140T, the boundary trench 150T and the peripheral trenches 160T, and planarizing the insulating layer until a top surface of the substrate 100 is exposed, e.g., until top surfaces of the cell active patterns CACT, the bumper pattern BP and the peripheral active patterns PACT. Top surfaces of the cell active patterns CACT, the bumper pattern BP and the peripheral active patterns PACT may be exposed by a planarization process of planarizing the insulating layer. By the planarization process, the cell device isolation patterns 130C1 and 130C2, the dummy insulating pattern 140, the boundary insulating pattern 150 and the peripheral device isolation patterns 160 may be locally formed in the cell trenches 130T1 and 130T2, the dummy trench 140T, the boundary trench 150T and the peripheral trenches 160T, respectively.

The cell device isolation patterns 130C1 and 130C2 may include first cell device isolation patterns 130C1 having the first width W1, and second cell device isolation patterns 130C2 having the second width W2. Bottom surfaces 130B1 of the first cell device isolation patterns 130C1 may be located at a lower height than bottom surfaces 130B2 of the second cell device isolation patterns 130C2. The dummy insulating pattern 140 may have the third width W3. A bottom surface 140B of the dummy insulating pattern 140 may be located at a lower height than the bottom surfaces 130B1 of the first cell device isolation patterns 130C1 and the bottom surfaces 130B2 of the second cell device isolation patterns 130C2. The boundary insulating pattern 150 may have the fourth width W4. A bottom surface 150B of the boundary insulating pattern 150 may be located at a lower height than the bottom surfaces 130B1 of the first cell device isolation patterns 130C1 and the bottom surfaces 130B2 of the second cell device isolation patterns 130C2. For some examples, the bottom surface 150B of the boundary insulating pattern 150 may be located at substantially the same height as the bottom surface 140B of the dummy insulating pattern 140. For certain examples, the bottom surface 150B of the boundary insulating pattern 150 may be located at a higher or lower height than the bottom surface 140B of the dummy insulating pattern 140. Bottom surfaces 160B of the peripheral device isolation patterns 160 may be located at a lower height than the bottom surfaces 130B1 of the first cell device isolation patterns 130C1 and the bottom surfaces 130B2 of the second cell device isolation patterns 130C2. For example, the bottom surfaces 160B of the peripheral device isolation pattern 160 may be at the same vertical level as the bottom surface 150B of the boundary insulating pattern 150 and/or the bottom surface 140B of the dummy insulating pattern 140.

Referring again to FIGS. 2 to 5, word lines WL may be formed on the cell region CR of the substrate 100 and may intersect the cell active patterns CACT and the cell device isolation patterns 130C1 and 130C2. One or more word lines WL of the word lines WL may extend in the first direction D1 to intersect the bumper pattern BP.

A first dopant injection region SD1 and second dopant injection regions SD2 may be formed in each of the cell active patterns CACT. The first dopant injection region SD1 may be formed between a pair of the word lines WL intersecting each of the cell active patterns CACT, and each of the second dopant injection regions SD2 may be formed at a side of each of the pair of word lines WL. An insulating layer 305 may be formed on the cell region CR of the substrate 100 and may cover the word lines WL, the cell active patterns CACT, the cell device isolation patterns 130C1 and 130C2, the dummy insulating pattern 140, and the bumper pattern BP.

Bit lines BL may be formed on the insulating layer 305 of the cell region CR of the substrate 100 and may intersect the word lines WL, e.g., in a plan view. For example, the bit lines BL may cross over the word lines WL. Bit line contacts DC may be formed under each of the bit lines BL. Each of the bit line contacts DC may be electrically connected to the first dopant injection region SD1 of each of the cell active patterns CACT. A lower filling insulation layer 341 may be formed on a sidewall of each of the bit line contacts DC. Bit line capping patterns 337 may be formed on the bit lines BL, respectively.

Storage node contacts BC and support patterns 350 may be formed between a pair of the bit lines BL adjacent to each other. The storage node contacts BC and the support patterns 350 may be formed to be alternately arranged between the pair of bit lines BL. Each of the storage node contacts BC may be electrically connected to a corresponding one of the second dopant injection regions SD2 of each of the cell active patterns CACT. A bit line spacer SP may be formed between each of the bit lines BL and the storage node contacts BC and between each of the bit lines BL and the support patterns 350.

A storage node ohmic layer 309 may be formed on each of the storage node contacts BC, and a diffusion barrier pattern 311 may be formed to conformally cover the storage node ohmic layer 309, the bit line spacer SP, and a corresponding bit line capping pattern 337. A landing pad LP may be formed on the diffusion barrier pattern 311, and a first capping pattern 358 and a second capping pattern 360 may be formed between the landing pads LP adjacent to each other.

Lower electrodes BE may be formed on the landing pads LP, respectively. An etch stop layer 370 may be formed to cover the first and second capping patterns 358 and 360 between the lower electrodes BE. An upper support pattern SS1 may be formed on upper sidewalls of the lower electrodes BE, and a lower support pattern SS2 may be formed on lower sidewalls of the lower electrodes BE. A dielectric layer DL may be formed to cover surfaces of the lower electrodes BE and surfaces of the upper and lower support patterns SS1 and SS2, and an upper electrode TE may be formed on the dielectric layer DL to fill a space between the lower electrodes BE. The lower electrodes BE, the dielectric layer DL and the upper electrode TE may constitute capacitors CA.

Peripheral word lines PWL may be formed on the peripheral region PR of the substrate 100 to intersect the peripheral active patterns PACT. A first interlayer insulating layer 400 may be formed on the cell region CR, the boundary region BR and the peripheral region PR of the substrate 100. The first interlayer insulating layer 400 may cover the word lines WL, the bit lines BL and the bumper pattern BP on the cell region CR and may extend onto the boundary region BR to cover the boundary insulating pattern 150. The first interlayer insulating layer 400 may extend onto the peripheral region PR and may cover the peripheral word lines PWL.

Peripheral contacts 410 may be formed in the first interlayer insulating layer 400 and may penetrate the first interlayer insulating layer 400 so as to contact and/or be electrically connected to a corresponding one of the peripheral active patterns PACT. Peripheral interconnection lines 420 may be formed on the first interlayer insulating layer 400 and may contact and/or be electrically connected to the peripheral contacts 410.

A second interlayer insulating layer 500 may be formed on the first interlayer insulating layer 400 of the peripheral region PR of the substrate 100. The second interlayer insulating layer 500 may be formed to cover/contact the peripheral interconnection lines 420 and a sidewall of the capacitor CA.

Figure 18:
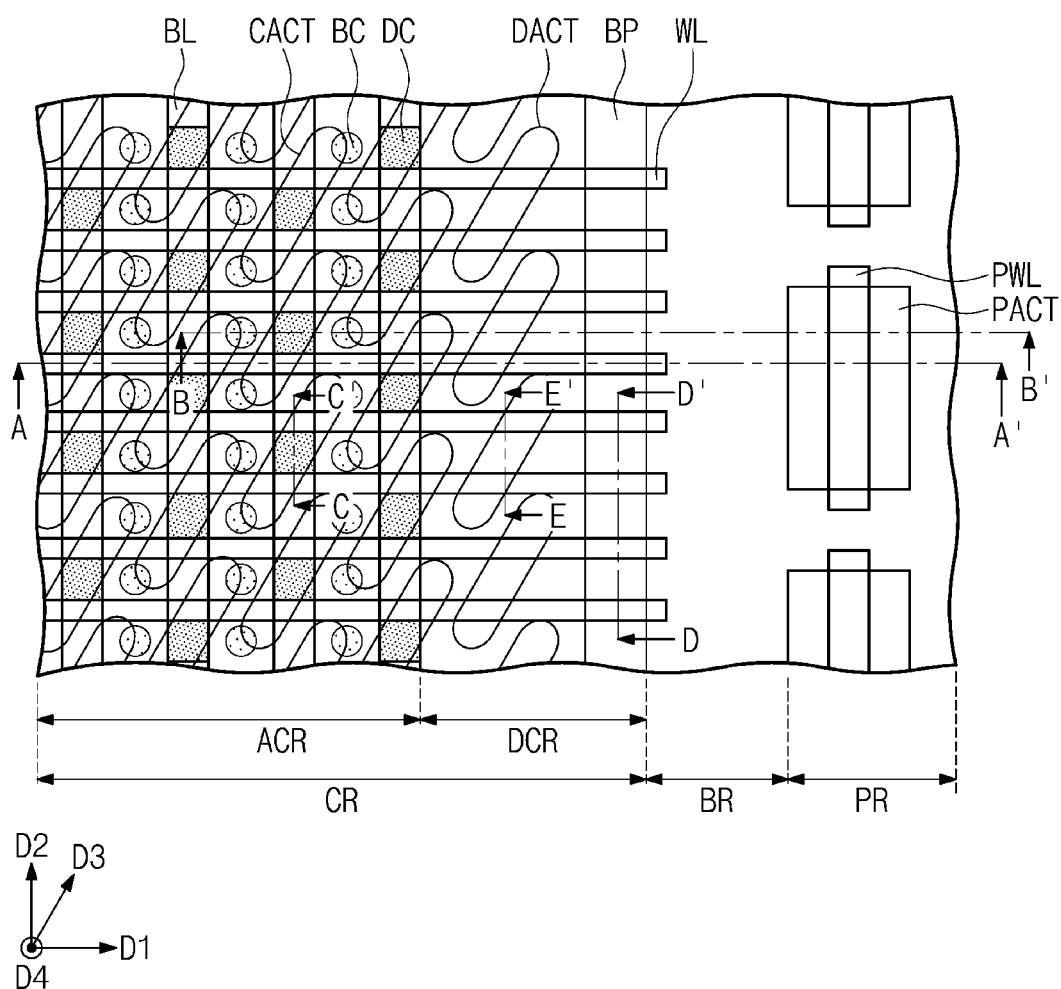
FIG. 18 is a plan view corresponding to the portion 'P1' of FIG. 1 to illustrate a semiconductor device according to some embodiments of the inventive concepts.
Figure 19:
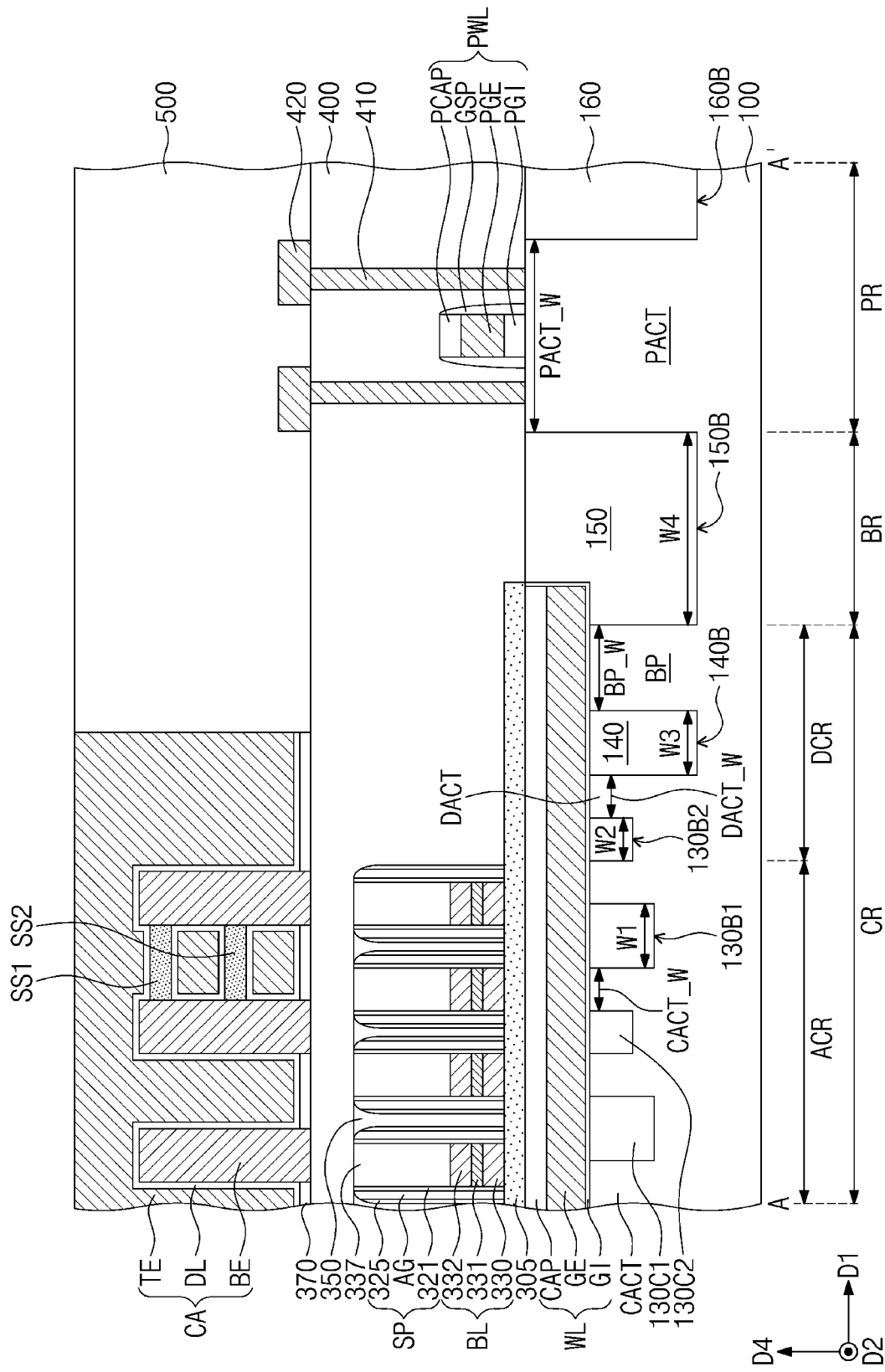
FIG. 19 is a cross-sectional view taken along a line A-A' of FIG. 18.
Figure 20:
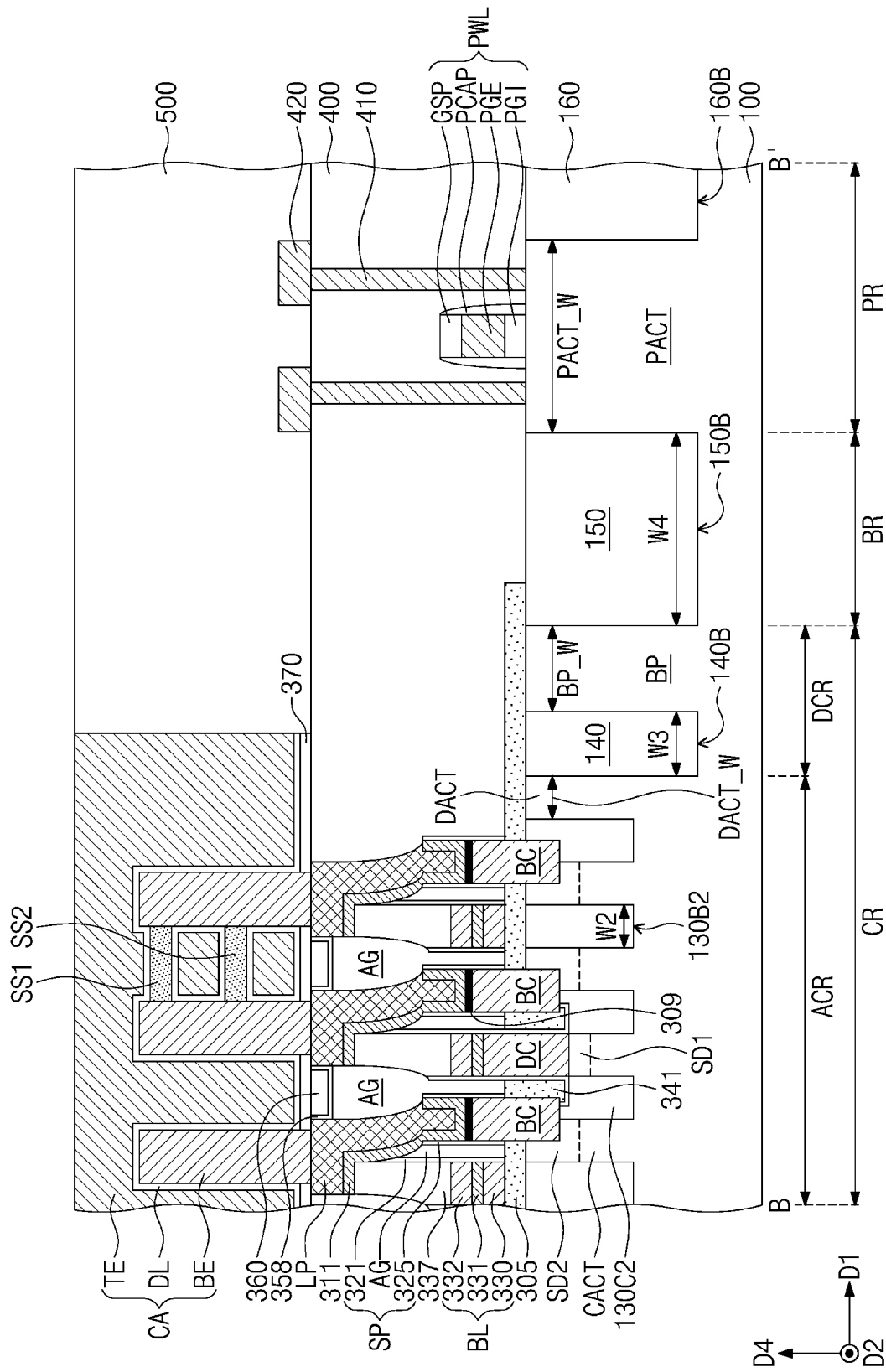
FIG. 20 is a cross-sectional view taken along a line B-B' of FIG. 18.
Figure 21:
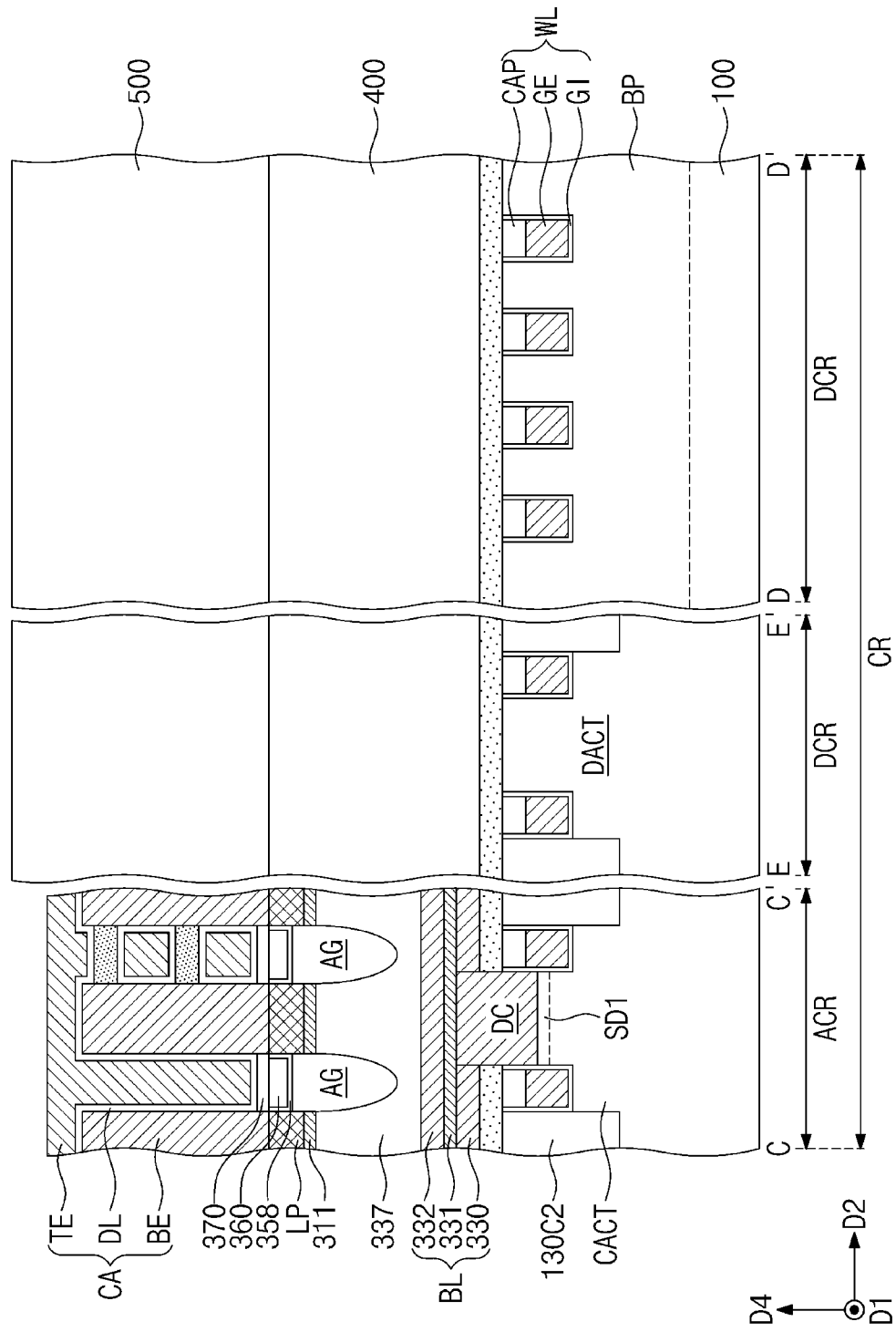
FIG. 21 is a cross-sectional view taken along lines C-C', D-D' and E-E' of FIG. 18.

FIG. 18 is a plan view corresponding to the portion 'P1' of FIG. 1 to illustrate a semiconductor device according to some embodiments of the inventive concepts. FIG. 19 is a cross-sectional view taken along a line A-A' of FIG. 18, FIG. 20 is a cross-sectional view taken along a line B-B' of FIG. 18, and FIG. 21 is a cross-sectional view taken along lines C-C', D-D' and E-E' of FIG. 18. Hereinafter, differences between the present embodiments and the embodiments described with reference to FIGS. 1 to 5 will be mainly described for the purpose of ease and convenience in explanation.

Referring to FIGS. 18 to 21, dummy cell active patterns DACT may be disposed on the cell region CR (e.g., the dummy cell region DCR) of the substrate 100. The dummy cell active patterns DACT may be disposed between the bumper pattern BP and the cell active patterns CACT. Each of the dummy cell active patterns DACT may have a bar shape extending in the third direction D3 and may be a portion of the substrate 100, which protrudes from the substrate 100 in the fourth direction D4. Each of the dummy cell active patterns DACT may have a width in the first direction D1. A width DACT_W of each of the dummy cell active patterns DACT may be substantially equal to the width CACT_W of each of the cell active patterns CACT and may be less than the width BP_W of the bumper pattern BP. The dummy insulating pattern 140 may be disposed between the bumper pattern BP and the dummy cell active patterns DACT on the cell region CR (e.g., the dummy cell region DCR) of the substrate 100.

In some embodiments, the dummy cell active patterns DACT, the dummy insulating pattern 140, the bumper pattern BP and the boundary insulating pattern 150 may be disposed between the cell active patterns CACT and the peripheral active patterns PACT. The bumper pattern BP may be disposed between the dummy insulating pattern 140 and the boundary insulating pattern 150. The dummy insulating pattern 140 may be disposed between the bumper pattern BP and the dummy cell active patterns DACT, and the boundary insulating pattern 150 may be disposed between the bumper pattern BP and the peripheral active patterns PACT.

The word lines WL may be disposed on the cell region CR of the substrate 100 and may intersect the cell active patterns CACT, the cell device isolation patterns 130C1 and 130C2, and the dummy cell active patterns DACT. One or more word lines WL of the word lines WL may extend in the first direction D1 to intersect the bumper pattern BP. Each of the word lines WL may include a cell gate electrode GE penetrating upper portions of the cell active patterns CACT, the cell device isolation patterns 130C1 and 130C2 and the dummy cell active patterns DACT, a cell gate dielectric pattern GI disposed between the cell gate electrode GE and the cell active patterns CACT, between the cell gate electrode GE and the cell device isolation patterns 130C1 and 130C2 and between the cell gate electrode GE and the dummy cell active patterns DACT, and a cell gate capping pattern CAP on a top surface of the cell gate electrode GE. A top surface of the cell gate capping pattern CAP may be substantially coplanar with top surfaces of the cell active patterns CACT and top surfaces of the dummy cell active patterns DACT. For example, the top surface of the cell gate capping pattern CAP may be located at substantially the same height as the top surfaces of the cell active patterns CACT and the top surfaces of the dummy cell active patterns DACT.

The insulating layer 305 may be disposed on the cell region CR of the substrate 100 and may cover the word lines WL, the cell active patterns CACT, the cell device isolation patterns 130C1 and 130C2, the dummy cell active patterns DACT, the dummy insulating pattern 140, and the bumper pattern BP.

Except for the differences described above, other components and features of the semiconductor device according to the present embodiments may be the same or substantially the same as corresponding components and features of the semiconductor device described with reference to FIGS. 1 to 5.

Figure 22:
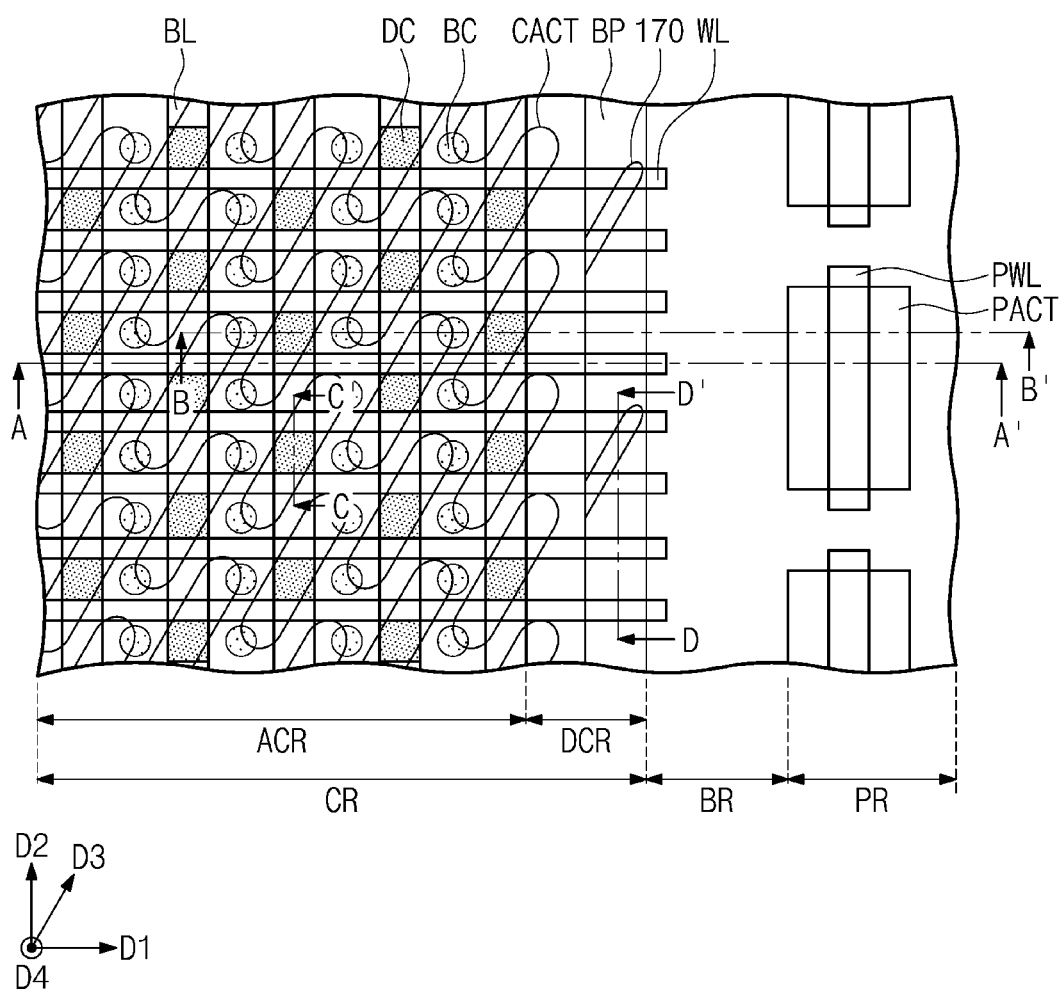
FIG. 22 is a plan view corresponding to the portion 'P1' of FIG. 1 to illustrate a semiconductor device according to some embodiments of the inventive concepts.
Figure 23:
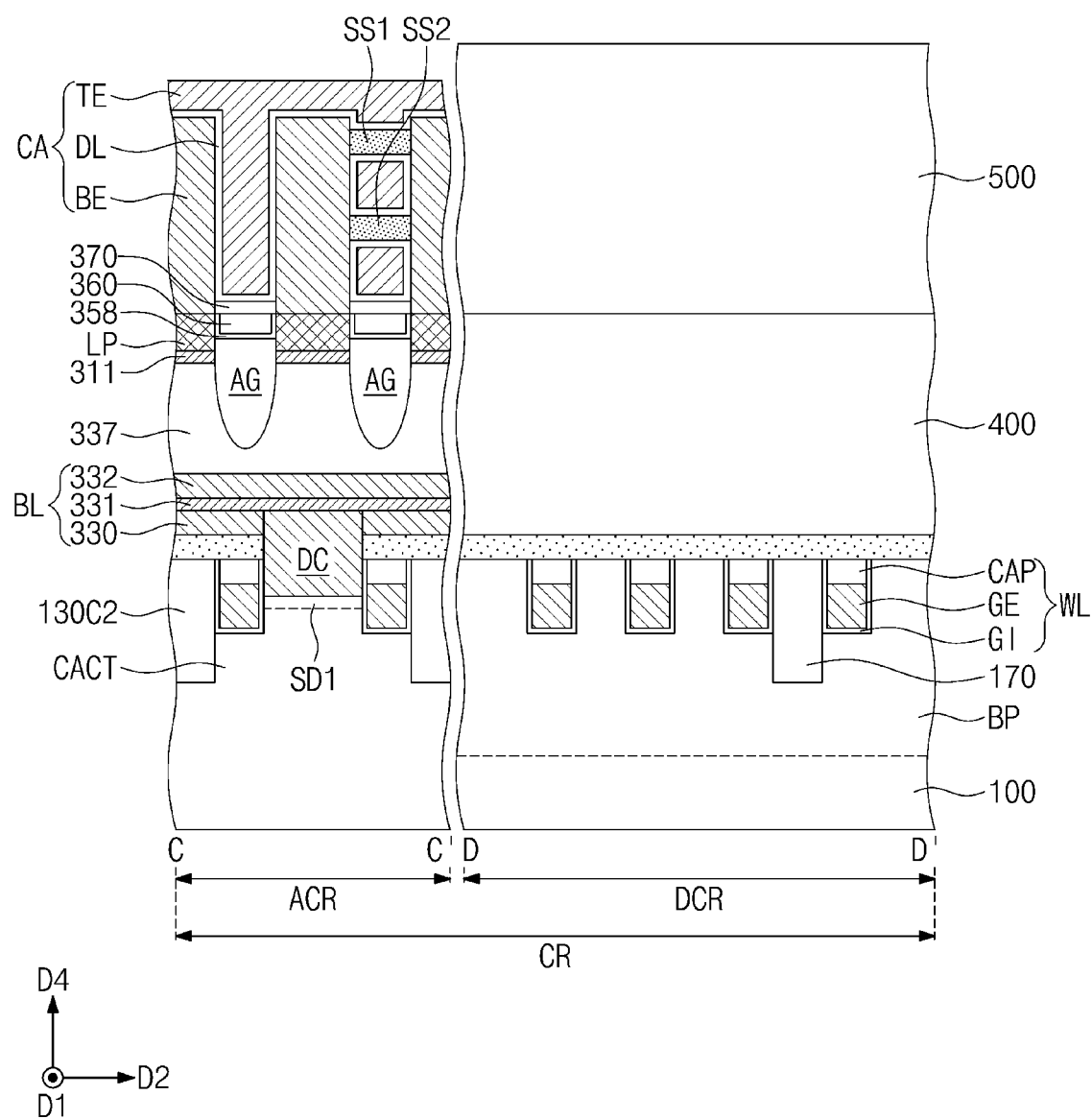
FIG. 23 is a cross-sectional view taken along lines C-C' and D-D' of FIG. 22.

FIG. 22 is a plan view corresponding to the portion 'P1' of FIG. 1 to illustrate a semiconductor device according to some embodiments of the inventive concepts. FIG. 23 is a cross-sectional view taken along lines C-C' and D-D' of FIG. 22. Cross-sectional views taken along lines A-A' and B-B' of FIG. 22 may be the same or substantially the same as FIGS. 3 and 4, respectively. Hereinafter, differences between the present embodiments and the embodiments described with reference to FIGS. 1 to 5 will be mainly described for the purpose of ease and convenience in explanation.

Referring to FIGS. 22 and 23, at least one line insulating pattern 170 may be disposed in the bumper pattern BP. The line insulating pattern 170 may penetrate an upper portion of the bumper pattern BP and may extend in the third direction D3. The line insulating pattern 170 may have a bar shape extending in the third direction D3. For example, the line insulating pattern 170 may include or be formed of silicon oxide, silicon nitride, and/or silicon oxynitride. Except for the differences described above, other components and features of the semiconductor device according to the present embodiments may be the same or substantially the same as corresponding components and features of the semiconductor device described with reference to FIGS. 1 to 5.

Figure 24:
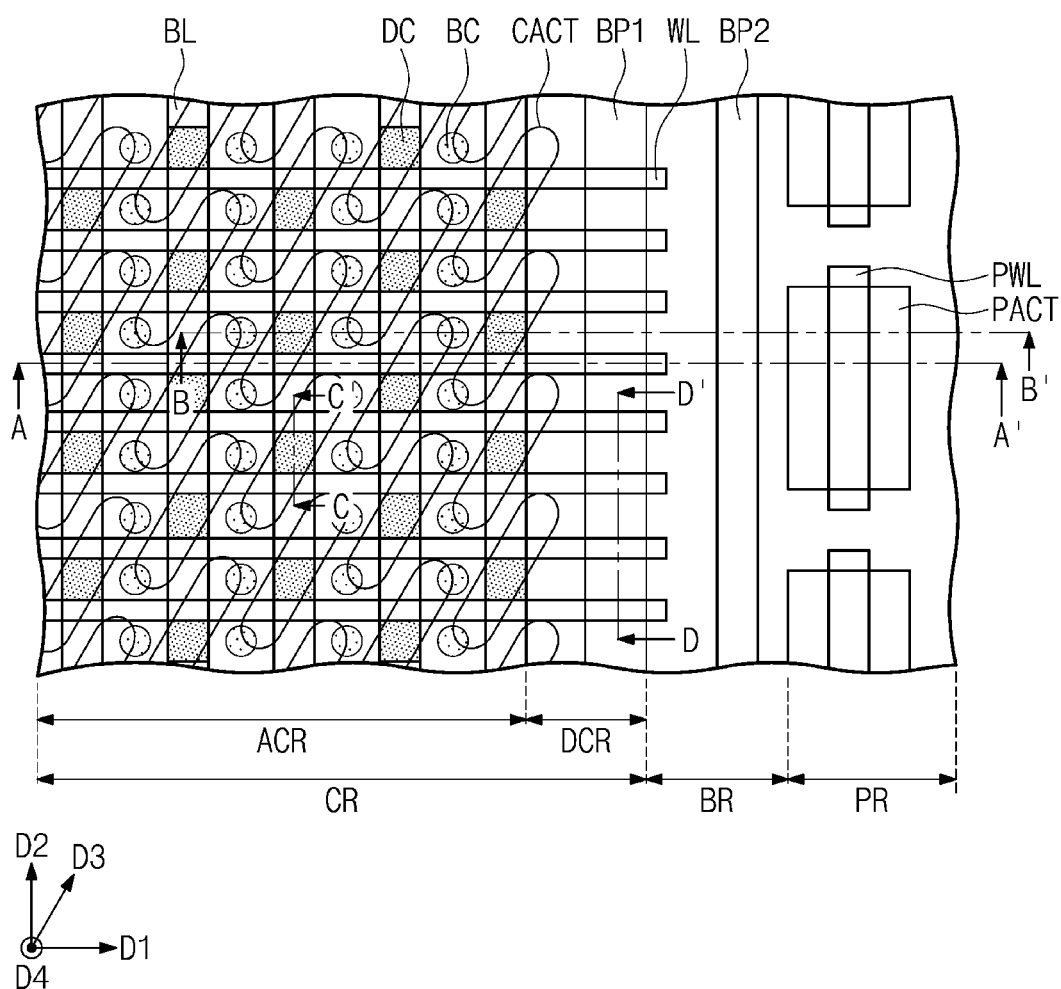
FIG. 24 is a plan view corresponding to the portion 'P1' of FIG. 1 to illustrate a semiconductor device according to some embodiments of the inventive concepts.
Figure 25:
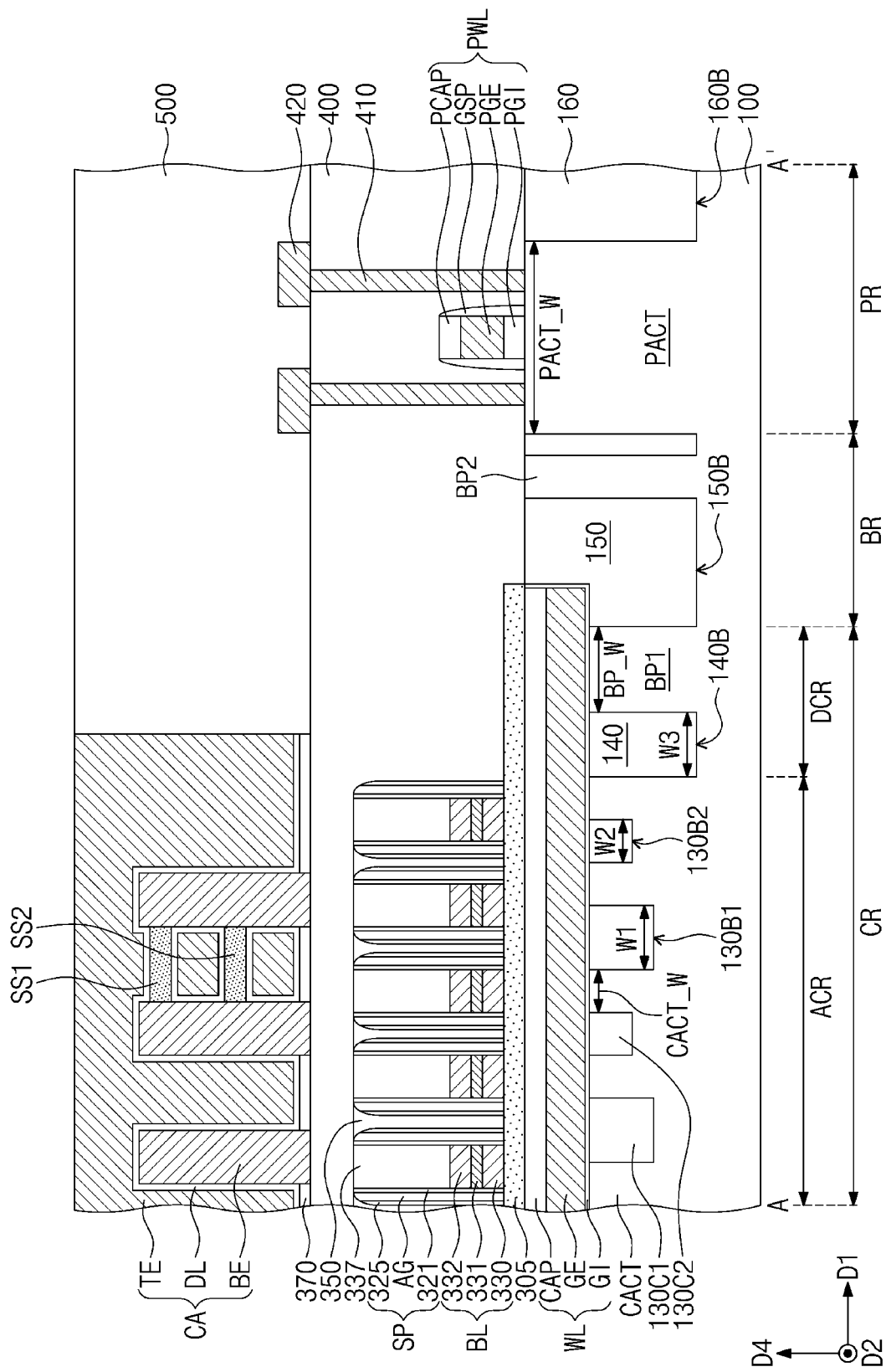
FIG. 25 is a cross-sectional view taken along a line A-A' of FIG. 24.
Figure 26:
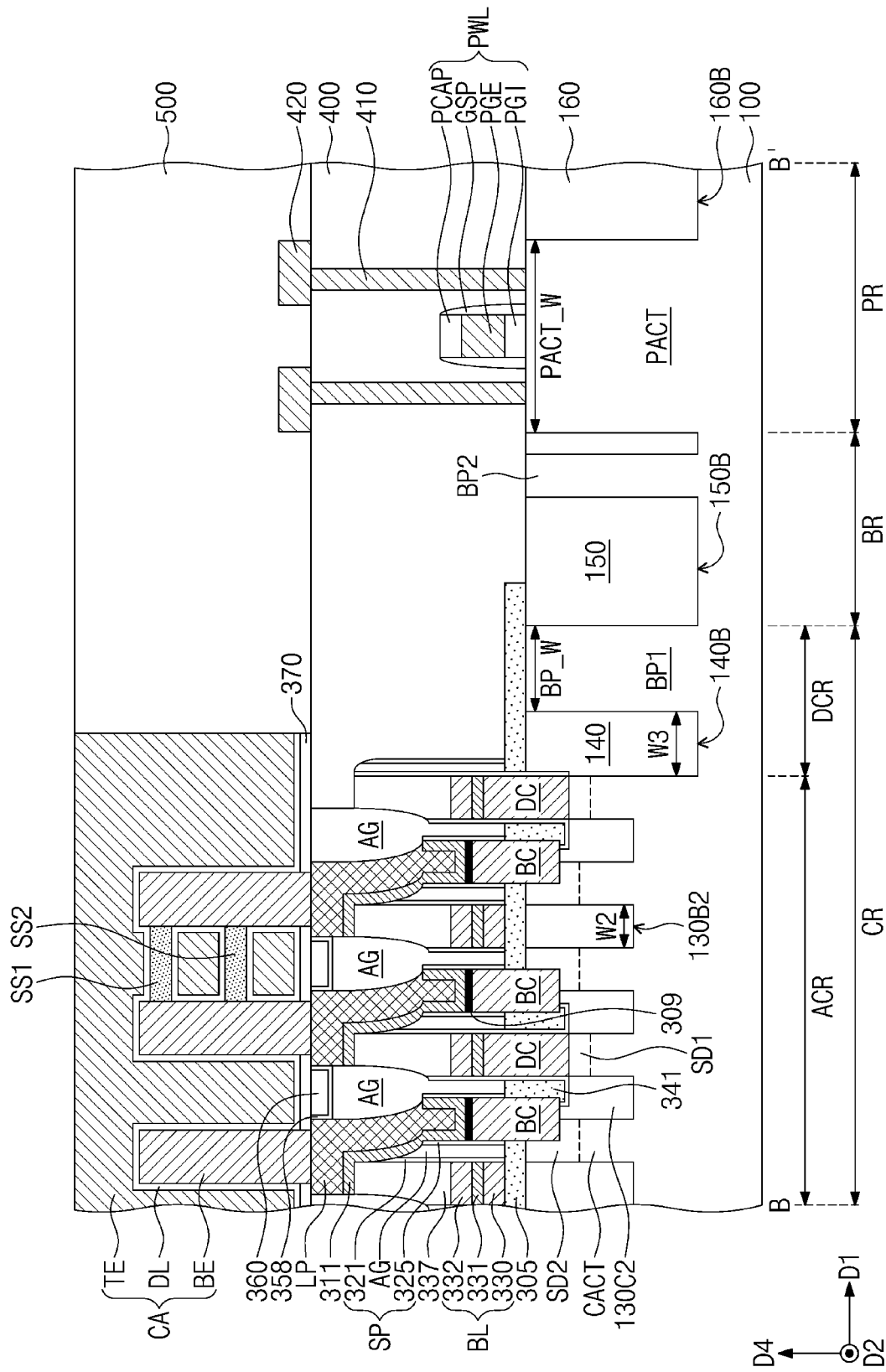
FIG. 26 is a cross-sectional view taken along a line B-B' of FIG. 24.

FIG. 24 is a plan view corresponding to the portion 'P1' of FIG. 1 to illustrate a semiconductor device according to some embodiments of the inventive concepts. FIG. 25 is a cross-sectional view taken along a line A-A' of FIG. 24, and FIG. 26 is a cross-sectional view taken along a line B-B' of FIG. 24. A cross-sectional view taken along lines C-C' and D-D' of FIG. 24 may be the same or substantially the same as FIG. 5. Hereinafter, differences between the present embodiments and the embodiments described with reference to FIGS. 1 to 5 will be mainly described for the purpose of ease and convenience in explanation.

Referring to FIGS. 24 to 26, the bumper pattern BP described with reference to FIGS. 1 to 5 may be referred to as a first bumper pattern BP1. In some embodiments, a second bumper pattern BP2 may be disposed on the boundary region BR of the substrate 100 and may be disposed between the first bumper pattern BP1 and the peripheral active patterns PACT. The second bumper pattern BP2 may be a portion of the substrate 100, which protrudes from the substrate 100 in the fourth direction D4. For example, the second bumper pattern BP2 may be formed by patterning an upper portion of the substrate 100. The second bumper pattern BP2 may penetrate the boundary insulating pattern 150. For example, the second bumper pattern BP2 may have a line shape extending in the second direction D2.

In some embodiments, the dummy insulating pattern 140, the first bumper pattern BP1, the boundary insulating pattern 150 and the second bumper pattern BP2 may be disposed between the cell active patterns CACT and the peripheral active patterns PACT. The first bumper pattern BP1 may be disposed between the dummy insulating pattern 140 and the boundary insulating pattern 150. The dummy insulating pattern 140 may be disposed between the first bumper pattern BP1 and the cell active patterns CACT, and the boundary insulating pattern 150 may be disposed between the first bumper pattern BP1 and the peripheral active patterns PACT. The second bumper pattern BP2 may penetrate the boundary insulating pattern 150 and may be disposed between the first bumper pattern BP1 and the peripheral active patterns PACT.

The word lines WL may be disposed on the cell region CR of the substrate 100 and may intersect the cell active patterns CACT and the cell device isolation patterns 130C1 and 130C2. One or more word lines WL of the word lines WL may extend in the first direction D1 to intersect the first bumper pattern BP1. In some embodiments, the second bumper pattern BP2 may be spaced apart from the word lines WL. For example, the second bumper pattern BP2 may not contact the word lines WL.

The first interlayer insulating layer 400 may cover the word lines WL, the bit lines BL and the first bumper pattern BP1 on the cell region CR and may extend onto the boundary region BR to cover the boundary insulating pattern 150 and the second bumper pattern BP2. The first interlayer insulating layer 400 may extend onto the peripheral region PR and may cover the peripheral word lines PWL. For example, the first interlayer insulating layer 400 may contact side surfaces and a top surface of the peripheral word lines PWL.

Except for the differences described above, other components and features of the semiconductor device according to the present embodiments may be the same or substantially the same as corresponding components and features of the semiconductor device described with reference to FIGS. 1 to 5.

According to the embodiments of the inventive concepts, the bumper pattern having a size greater than those of the cell active patterns (e.g., a width/height greater than those of the cell active patterns) may be disposed between the boundary insulating pattern and the cell active patterns and/or in the boundary insulating pattern. In this case, it may be beneficial to inhibit or prevent strain caused by the boundary insulating pattern from affecting the cell active patterns, and thus a bent phenomenon of the cell active patterns may be prevented/improved. In addition, dummy cell active patterns having widths equal to those of the cell active patterns may not be additionally formed between the boundary insulating pattern and the cell active patterns, or the number of the dummy cell active patterns may be minimized. Thus, a chip size of a semiconductor device may be easily reduced. As a result, the embodiments of the inventive concepts may provide semiconductor devices capable of minimizing pattern defects of the cell active patterns and of easily reducing the chip size, and the method of manufacturing the same.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
    a substrate including a cell region, a peripheral region, and a boundary region dividing the cell region from the peripheral region, wherein the boundary region has a boundary trench between the cell region from the peripheral region;
    cell active patterns on the cell region of the substrate;
    peripheral active patterns on the peripheral region of the substrate;
    a boundary insulating pattern disposed in the boundary trench and disposed between the cell active patterns and the peripheral active patterns;
    a bumper pattern disposed on the cell region of the substrate and extending along the boundary insulating pattern between the boundary insulating pattern and the cell active patterns; and
    word lines disposed on the cell region of the substrate, extending in a first direction, and spaced apart from each other in a second direction, the first and second directions parallel to a top surface of the substrate and crossing each other,
    wherein the bumper pattern has a line shape that extends in the second direction, and the word lines extend in the first direction to intersect the cell active patterns and the bumper pattern,
    wherein each of the word lines vertically overlaps the bumper pattern in a third direction perpendicular to the top surface of the substrate, and
    wherein a width of the bumper pattern in the first direction is greater than a width of each of the cell active patterns in the first direction.

2. The semiconductor device of claim 1,
    wherein each of the cell active patterns has a bar shape extending in a fourth direction which is parallel to the top surface of the substrate and intersects the first and second directions.

3. The semiconductor device of claim 2, wherein the width of the bumper pattern is less than a width of each of the peripheral active patterns in the first direction.

4. The semiconductor device of claim 2, further comprising:
    at least one dummy cell active pattern between the bumper pattern and the cell active patterns,
    wherein the width of the bumper pattern is greater than a width of the at least one dummy cell active pattern in the first direction.

5. The semiconductor device of claim 4, wherein the at least one dummy cell active pattern has a bar shape extending in the fourth direction.

6. The semiconductor device of claim 2, further comprising:
    a line insulating pattern disposed in the bumper pattern,
    wherein the line insulating pattern penetrates an upper portion of the bumper pattern and extends in the fourth direction.

7. The semiconductor device of claim 1, further comprising:
    cell device isolation patterns disposed between the cell active patterns on the cell region of the substrate; and
    a dummy insulating pattern disposed between the bumper pattern and the cell active patterns on the cell region of the substrate,
    wherein a bottom surface of the dummy insulating pattern is located at a lower height than bottom surfaces of the cell device isolation patterns.

8. The semiconductor device of claim 7, wherein the bumper pattern is disposed between the dummy insulating pattern and the boundary insulating pattern.

9. The semiconductor device of claim 8, wherein a bottom surface of the boundary insulating pattern is located at a lower height than the bottom surfaces of the cell device isolation patterns.

10. The semiconductor device of claim 9, wherein a width of the dummy insulating pattern in the first direction is less than a width of the boundary insulating pattern in the first direction.

11. The semiconductor device of claim 7, wherein the cell device isolation patterns include first cell device isolation patterns and second cell device isolation patterns, wherein a first width of each of the first cell device isolation patterns in the first direction is greater than a second width of each of the second cell device isolation patterns in the first direction, and wherein a third width of the dummy insulating pattern in the first direction is greater than the second width of each of the second cell device isolation patterns.

12. The semiconductor device of claim 11, wherein the third width of the dummy insulating pattern is equal to or greater than the first width of each of the first cell device isolation patterns.

13. The semiconductor device of claim 11, wherein the third width of the dummy insulating pattern is less than a fourth width of the boundary insulating pattern in the first direction.

14. The semiconductor device of claim 1, wherein the word lines penetrate upper portions of the cell active patterns and an upper portion of the bumper pattern.

15. The semiconductor device of claim 1, wherein each of the word lines comprises:
 a gate electrode penetrating upper portions of corresponding cell active patterns of the cell active patterns and an upper portion of the bumper pattern; and
 a gate capping pattern on a top surface of the gate electrode,
 wherein a top surface of the gate capping pattern is substantially coplanar with top surfaces of the corresponding cell active patterns and a top surface of the bumper pattern.

16. The semiconductor device of claim 1, further comprising:
 an additional bumper pattern disposed between the bumper pattern and the peripheral active patterns and penetrating the boundary insulating pattern,
 wherein the additional bumper pattern is spaced apart from the word lines.

17. A semiconductor device comprising:
 a substrate including a cell region and a peripheral region;
 cell active patterns on the cell region of the substrate;
 peripheral active patterns on the peripheral region of the substrate;
 a bumper pattern disposed between the cell active patterns and the peripheral active patterns on the substrate; and
 word lines disposed on the cell region of the substrate, extending in a first direction parallel to a top surface of the substrate, and spaced apart from each other in a second direction, the first and second directions parallel to a top surface of the substrate and crossing to each other,
 wherein the bumper pattern has a line shape that extends in the second direction, and the word lines extend in the first direction to intersect the cell active patterns and the bumper pattern, and
 wherein each of the word lines vertically overlaps the bumper pattern in a third direction perpendicular to the top surface of the substrate.

* * * * *